US012601980B2

(12) United States Patent
Nishino et al.

(10) Patent No.: US 12,601,980 B2
(45) Date of Patent: Apr. 14, 2026

(54) STAGE APPARATUS, EXPOSURE APPARATUS, METHOD OF MANUFACTURING FLAT PANEL DISPLAY, AND DEVICE MANUFACTURING METHOD

(71) Applicant: NIKON CORPORATION, Tokyo (JP)

(72) Inventors: Hideaki Nishino, Tokyo (JP); Atsushi Hara, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 224 days.

(21) Appl. No.: 18/072,144

(22) Filed: Nov. 30, 2022

(65) Prior Publication Data

US 2023/0094685 A1 Mar. 30, 2023

Related U.S. Application Data

(63) Continuation of application No. PCT/JP2020/023486, filed on Jun. 15, 2020.

(51) Int. Cl.
*G03F 7/00* (2006.01)

(52) U.S. Cl.
CPC ................................. *G03F 7/70716* (2013.01)

(58) Field of Classification Search
CPC ........ G03F 7/70716; G03F 7/20; G03F 7/709; G03F 7/70866; H01L 21/68; H01L 21/68785
See application file for complete search history.

(56) References Cited

U.S. PATENT DOCUMENTS

| | | | |
|---|---|---|---|
| 5,729,331 A | 3/1998 | Tanaka et al. | |
| 6,552,775 B1 | 4/2003 | Yanagihara et al. | |
| 7,307,698 B2 * | 12/2007 | Miyajima ........... | G03F 7/70783 |
| | | | 355/75 |
| 10,514,616 B2 * | 12/2019 | Aoki ................... | G03F 7/70791 |

(Continued)

FOREIGN PATENT DOCUMENTS

| | | |
|---|---|---|
| JP | 2000-243693 A | 9/2000 |
| JP | 2006-086442 A | 3/2006 |

(Continued)

OTHER PUBLICATIONS

Aug. 11, 2020 International Search Report issued in International Patent Application No. PCT/JP2020/023486.

(Continued)

*Primary Examiner* — Hung V Nguyen
(74) *Attorney, Agent, or Firm* — Oliff PLC

(57) ABSTRACT

A stage apparatus includes a movable body having a first support surface for supporting an object, a support portion that is elastically deformable, has a predetermined thickness, and supports the movable body, a support device having a second support surface that supports the support portion, and a drive unit configured to move the movable body so that an angle between the first support surface and the second support surface is changed, wherein the support portion elastically deforms so that the predetermined thickness at a first side where an interval between the first support surface and the second support surface is narrow becomes small and the predetermined thickness at a second side where the interval between the first support surface and the second support surface is wide becomes large in accordance with a change in the angle caused by the drive unit to support the movable body.

16 Claims, 14 Drawing Sheets

(56)                    References Cited

U.S. PATENT DOCUMENTS

| | | | | |
|---|---|---|---|---|
| 11,774,864 B2 * | 10/2023 | Aoki | ..................... | H01L 21/677 |
| | | | | 355/72 |
| 2010/0018950 A1 | 1/2010 | Aoki et al. | | |
| 2012/0057140 A1 | 3/2012 | Aoki | | |
| 2017/0108785 A1 | 4/2017 | Aoki | | |
| 2020/0019071 A1 | 1/2020 | Aoki | | |

FOREIGN PATENT DOCUMENTS

| | | | |
|---|---|---|---|
| JP | 2010-060016 A | 3/2010 | |
| JP | 2011-249555 A | 12/2011 | |
| JP | 2019185056 A | 10/2019 | |
| WO | 2010/131485 A1 | 11/2010 | |
| WO | 2015/147039 A1 | 10/2015 | |

OTHER PUBLICATIONS

Aug. 11, 2020 Written Opinion issued in International Patent Application No. PCT/JP2020/023486.
Sep. 5, 2023 Office Action issued in Japanese Patent Application No. 2022-531127.
Oct. 30, 2024 Office Action issued in Taiwanese Patent Application No. 110121165.
Mar. 24, 2025 Office Action issued in Chinese Patent Application No. 202080101898.5.
Aug. 29, 2025 Office Action issued in Chinese Patent Application No. 202080101898.5.
Feb. 11, 2025 Office Action issued in Korean Patent Application No. 10-2022-7043446.
Dec. 30, 2025 Office Action issued in Taiwanese Patent Application No. 114133492.

* cited by examiner

STAGE APPARATUS, EXPOSURE APPARATUS, METHOD OF MANUFACTURING FLAT PANEL DISPLAY, AND DEVICE MANUFACTURING METHOD

CROSS-REFERENCE TO RELATED APPLICATION

This application is based upon and claims the benefit of priority of the prior International Patent Application No. PCT/JP2020/023486, filed on Jun. 15, 2020, the entire contents of which are incorporated herein by reference.

FIELD

The present disclosure relates to a stage apparatus, an exposure apparatus, a method of manufacturing a flat panel display, and a device manufacturing method.

BACKGROUND

In a scan type exposure apparatus, an improvement in positioning accuracy of a stage is required along with an increase in size of a basal plate to be exposed and an increase in definition of a drawing pattern. Note that the technique related to the present disclosure is also disclosed in Japanese Patent Application Laid-Open No. 2011-249555.

SUMMARY

In a first aspect of the present disclosure, there is provided a stage apparatus including: a movable body having a first support surface for supporting an object; a support portion that is elastically deformable, has a predetermined thickness, and supports the movable body; a support device having a second support surface that supports the support portion; and a drive unit configured to move the movable body so that an angle between the first support surface and the second support surface is changed, wherein the support portion elastically deforms so that the predetermined thickness at a first side where an interval between the first support surface and the second support surface is narrow becomes small and the predetermined thickness at a second side where the interval between the first support surface and the second support surface is wide becomes large in accordance with a change in the angle caused by the drive unit to support the movable body.

In a second aspect of the present disclosure, there is provided a stage apparatus including: a movable body having a first support surface for supporting an object; a support portion including a first support member and a second support member that are elastically deformable and support the movable body from below; a support device having a second support surface that supports the support portion; and a drive unit configured to move the movable body so that an angle between the first support surface and the second support surface is changed, wherein the support portion elastically deforms so that the first support member supporting a first side where an interval between the first support surface and the second support surface is narrow contracts and the second support member supporting a second side where the interval between the first support surface and the second support surface is wide expands in accordance with a change in the angle caused by the drive unit to support the movable body.

In a third aspect of the present disclosure, there is provided a stage apparatus including: a movable body having a first support surface for supporting an object; a support portion that applies an upward force in a direction of gravity to a second support surface different from the first support surface to support the movable body; and a drive unit configured to move the movable body so that the movable body becomes, from a first state, in a second state in which an inclination angle of the first support surface is changed, wherein the support portion supports the movable body that becomes in the second state with different forces at a first position and a second position on the second support surface, the first position and the second position being different from each other in a direction intersecting the direction of gravity.

In a fourth aspect of the present disclosure, there is provided a stage apparatus including: a movable body having a first support surface for supporting an object; a support device having a second support surface that supports the movable body; and a support portion that is disposed between the movable body and the support device in a direction of gravity, supports the movable body, has a small thickness at a first side where an interval between the first support surface and the second support surface is narrow, and has a large thickness at a second side where the interval between the first support surface and the second support surface is wide.

In a fifth aspect of the present disclosure, there is provided a stage apparatus including: a movable body on which an object is placed; a support portion that supports the movable body from below; and a drive unit configured to drive the movable body to change an orientation of the movable body from a first state to a second state, wherein the support portion includes an elastic member that is elastically deformable with respect to a load applied from the movable body to the support portion, and the elastic member changes a height distribution of the elastic member according to a change in the orientation of the movable body caused by the drive unit.

In a sixth aspect of the present disclosure, there is provided a stage apparatus including: a movable body on which an object is placed; a support portion that supports the movable body from below; and a drive unit configured to drive the movable body to change an orientation of the movable body from a first state to a second state, wherein the support portion includes an elastic member that is elastically deformable with respect to a load applied from the movable body to the support portion, and the elastic member changes heights of the elastic member in a direction of gravity at positions different from each other in a direction orthogonal to the direction of gravity to heights different from each other according to a change in the orientation of the movable body caused by the drive unit.

In a seventh aspect of the present disclosure, there is provided a stage apparatus including: a movable body on which an object is placed; a support portion that supports the movable body from below; and a drive unit configured to drive the movable body to change an orientation of the movable body from a first state to a second state, wherein the support portion includes an elastic member that is elastically deformable with respect to a load applied from the movable body to the support portion, and the elastic member causes a ratio of heights of the elastic member in a direction of gravity at a first position and a second position to be different between the first state and the second state, the first position and the second position being different from each other in a direction orthogonal to the direction of gravity.

In an eighth aspect of the present disclosure, there is provided an exposure apparatus including: the above stage apparatus; and a pattern forming device configured to form a predetermined pattern on the object by an energy beam.

In a ninth aspect of the present disclosure, there is provided a method of manufacturing a flat panel display including: exposing an object using the above exposure apparatus; and developing the object that has been exposed.

In a tenth aspect of the present disclosure, there is provided a device manufacturing method including: exposing an object using the above exposure apparatus; and developing the object that has been exposed.

Note that the configurations of the embodiments described below may be appropriately improved, and at least a part of the configurations may be replaced with another configuration. Furthermore, constituent elements whose arrangement is not particularly limited are not limited to the arrangement disclosed in the embodiments, and can be arranged at positions where their functions can be achieved.

DESCRIPTION OF EMBODIMENTS

First Embodiment

First, a first embodiment of the present disclosure will be described with reference to FIG. 1 to FIG. 6.

Figure 1:
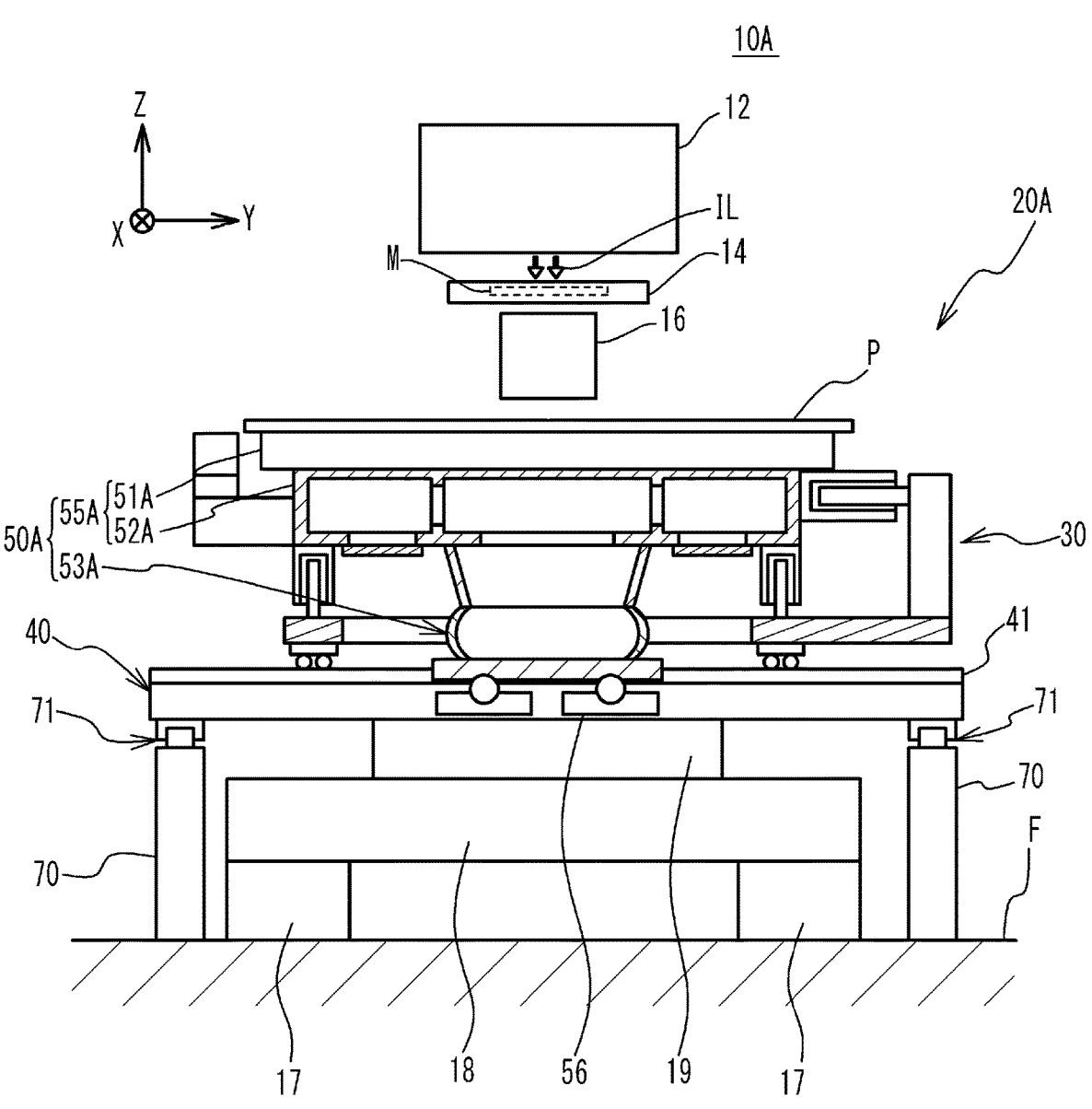
FIG. 1 schematically illustrates a configuration of an exposure apparatus in accordance with a first embodiment.
Figure 2:
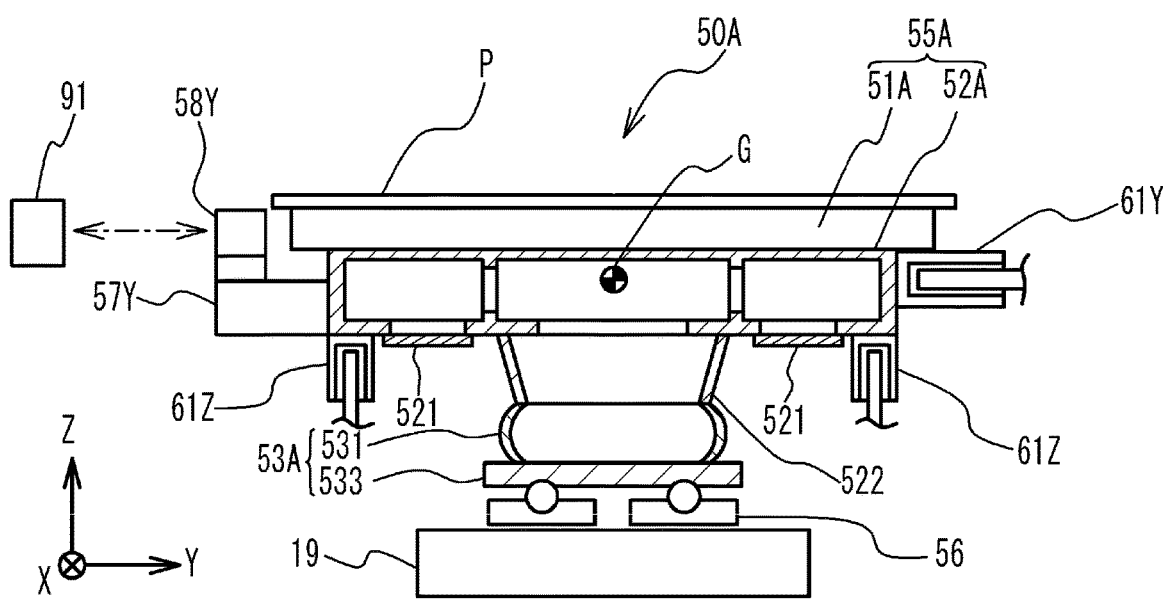
FIG. 2 schematically illustrates a configuration of a fine-adjustment stage included in the exposure apparatus of FIG. 1.
Figures 3A, 3B:
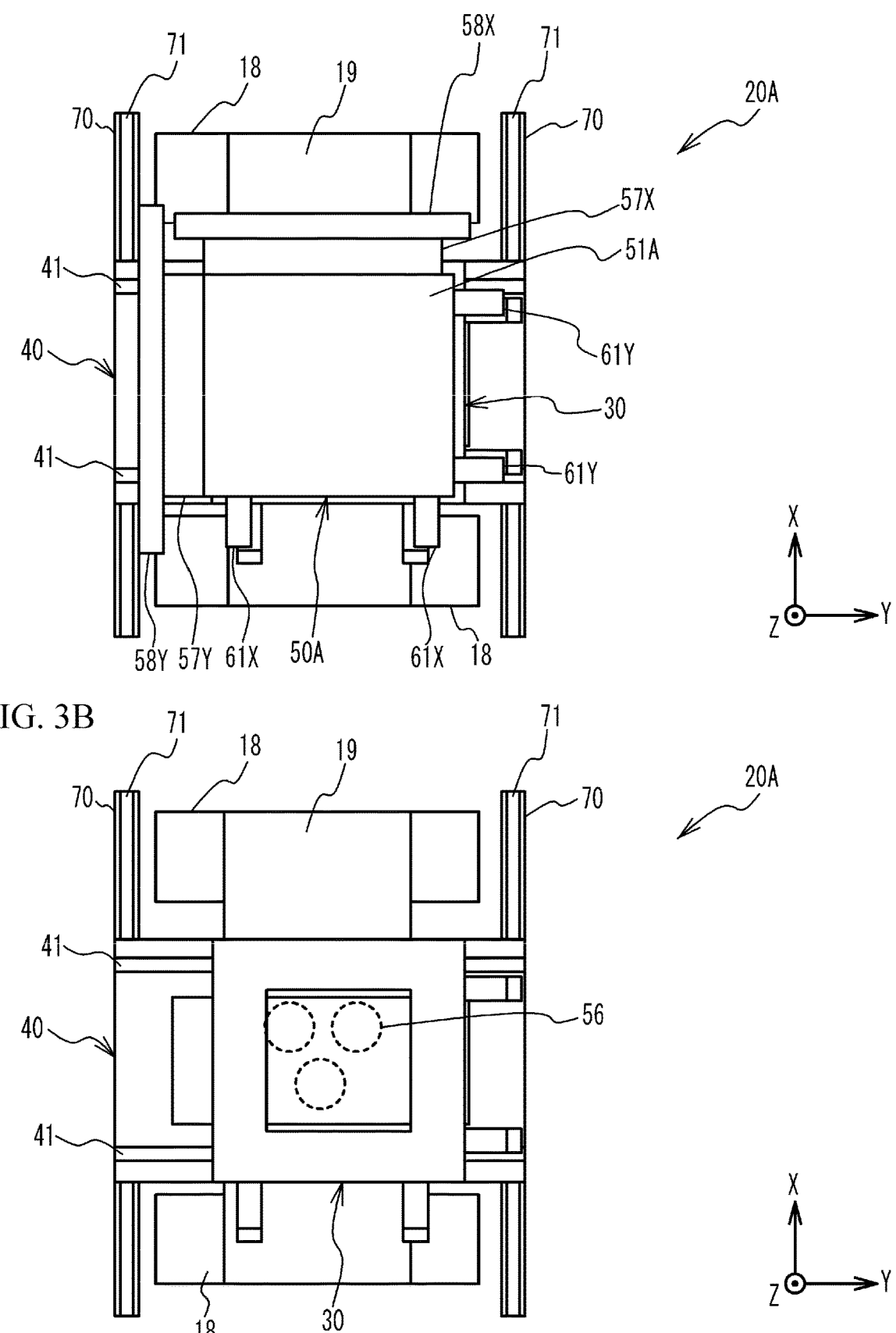
FIG. 3A is a plan view of a plate stage apparatus.
FIG. 3B is a plan view of the plate stage apparatus excluding the fine-adjustment stage.

FIG. 1 schematically illustrates a configuration of an exposure apparatus 10A in accordance with the first embodiment. FIG. 2 schematically illustrates a configuration of a fine-adjustment stage 50A in accordance with the first embodiment. FIG. 3A is a plan view of a plate stage apparatus 20A, and FIG. 3B is a plan view of the plate stage apparatus 20A excluding the fine-adjustment stage 50A. FIG. 4A is a plan view of the plate stage apparatus 20A excluding the fine-adjustment stage 50A and a Y coarse-adjustment stage 30.

The exposure apparatus 10A is a step-and-scan type projection-exposure apparatus, a so-called scanner, in which a rectangular (square) glass plate P (hereinafter, simply referred to as a plate P) used in, for example, a liquid crystal display device (flat panel display) or the like is an object to be exposed.

The exposure apparatus 10A includes an illumination system 12, a mask stage 14 that holds a mask M on which a pattern such as a circuit pattern is formed, a projection optical system 16, the plate stage apparatus 20A that holds the plate P whose front face (face facing the +Z side in FIG. 1) is coated with a resist (sensitive agent), and a control system for these components. In the following description, the direction in which the mask M and the plate P are scanned relative to the projection optical system 16 during exposure is defined as the X-axis direction, the direction orthogonal to the X-axis in the horizontal plane is defined as the Y-axis direction, and the direction orthogonal to the X-axis and the Y-axis is defined as the Z-axis direction. In addition, rotation (inclination) directions about the X-axis, the Y-axis, and the Z-axis will be defined as $\theta x$, $\theta y$, and $\theta z$ directions, respectively. Positions in the X-axis direction, the Y-axis direction, and the Z-axis direction will be referred to as an X-position, a Y-position, and a Z-position, respectively.

The illumination system 12 is configured similarly to an illumination system disclosed in, for example, U.S. Pat. No. 5,729,331. The illumination system 12 irradiates the mask M with light emitted from a light source (for example, a mercury lamp) (not illustrated) as illumination light for exposure (illumination light) IL through a reflecting mirror, a dichroic mirror, a shutter, a wavelength selection filter, various lenses, and the like (not illustrated). As the illumination light IL, for example, light such as i-line (wavelength: 365 nm), g-line (wavelength: 436 nm), or h-line (wavelength: 405 nm) (or combined light of the i-line, the g-line, and the h-line) is used.

The mask stage 14 holds the light-transmissive mask M. The mask stage 14 drives the mask M with a predetermined long stroke in the X-axis direction (the scanning direction) with respect to the illumination system 12 (the illumination light IL) through a drive system (not illustrated) including, for example, a linear motor, and finely drives the mask M in the Y-axis direction and the $\theta z$ direction. The positional information of the mask M in the horizontal plane is obtained by a mask stage position measuring system (not illustrated) including, for example, a laser interferometer or an encoder.

The projection optical system 16 is disposed below the mask stage 14. The projection optical system 16 is a so-called multi-lens type projection optical system having a configuration similar to that of a projection optical system disclosed in, for example, U.S. Pat. No. 6,552,775, and includes, for example, a plurality of both-side telecentric optical systems for forming an erect normal image.

In the exposure apparatus 10A, when the mask M positioned within a predetermined illumination region is illuminated by the illumination light IL from the illumination system 12, a projection image (a partial pattern image) of the pattern of the mask M in the illumination region is formed in an exposure region on the plate P by the illumination light having passed through the mask M through the projection optical system 16. Then, by moving the mask M relative to the illumination region (the illumination light IL) in the scanning direction and moving the plate P relative to the exposure region (the illumination light IL) in the scanning direction, scanning exposure of one shot region on the plate P is performed, and the pattern formed in the mask M (the entire pattern corresponding to the scanning range of the mask M) is transferred to that shot region. Here, the illumination region on the mask M and the exposure region (the irradiation region of the illumination light) on the plate P are in an optically conjugate relationship with each other by the projection optical system 16.

Plate Stage Apparatus 20A

The plate stage apparatus 20A is an apparatus for controlling the position of the plate P with respect to the projection optical system 16 (the illumination light IL) with high accuracy, and drives the plate P with a predetermined long stroke in the X-axis direction and the Y-axis direction, and also finely drives the plate P in directions of six degrees of freedom. The configuration of the plate stage apparatus used in the exposure apparatus 10A is not particularly limited, but in the first embodiment, the plate stage apparatus 20A having a so-called coarse/fine-adjustment configuration including a gantry type two-dimensional coarse-adjustment stage and a fine-adjustment stage finely driven with respect to the two-dimensional coarse-adjustment stage is used as disclosed in, for example, U.S. Patent Application Publication No. 2012/0057140.

As illustrated in FIG. 1, the plate stage apparatus 20A includes a pair of columns 18, a surface plate 19, the fine-adjustment stage 50A, a pair of base frames 70, the Y coarse-adjustment stage 30, an X coarse-adjustment stage 40, a plate drive system for driving each element constituting the plate stage apparatus 20A, a measurement system for measuring positional information of each element, and the like.

Each of the pair of the columns 18 is formed of a member extending in the Y-axis direction (see FIG. 3A and the like), and both end portions in the longitudinal direction thereof are supported from below by vibration isolation devices 17 installed on a floor (a floor surface) F (see FIG. 1). The pair of the columns 18 are arranged parallel to each other at a predetermined interval in the X-axis direction. The pair of the columns 18 on the vibration isolation devices 17 is installed on the floor (the floor surface) F separately from the pair of the base frames 70.

The surface plate 19 is formed of a member extending in the X-axis direction (see FIG. 3A and the like), and both end portions in the longitudinal direction thereof are supported from below by the pair of the columns 18. The flatness of the upper surface (the surface at the +Z side) of the surface plate 19 is finished to be very high. The upper surface of the surface plate 19 functions as a support surface that supports a support mechanism 53A.

As illustrated in FIG. 2, the fine-adjustment stage 50A includes a holding device 55A that holds the plate P and the support mechanism 53A that supports the holding device 55A. Although the details will be described later, the fine-adjustment stage 50A is supported by the surface plate 19 in a non-contact manner.

The holding device 55A includes a plate holder 51A and a plate stage 52A.

The plate P is placed on the upper surface of the plate holder 51A. The upper surface of the plate holder 51A functions as a support surface that supports the plate P. The dimensions of the upper surface of the plate holder 51A in the X-axis and Y-axis directions are set to be substantially the same as (actually slightly shorter than) those of the plate P. The flatness of the upper surface (the surface at the +Z side) of the plate holder 51A is finished to be very high. The plate P is held by vacuum suction on the plate holder 51A while being placed on the upper surface of the plate holder 51A, whereby almost the entirety (the entire surface) of the plate P is subjected to flatness correction along the upper surface of the plate holder 51A finished to have very high flatness.

The plate stage 52A supports the plate holder 51A. Some elements (for example, movable elements) of voice coil motors 61X, 61Y, and 61Z described later are attached to the plate stage 52A.

As illustrated in FIG. 2, the support mechanism 53A is disposed between the holding device 55A and the surface plate 19, and is fixed to the plate stage 52A. The support mechanism 53A applies an upward force in the direction of gravity to the lower surface of the plate stage 52A and supports the holding device 55A. The support mechanism 53A is supported by the surface plate 19 in a non-contact manner.

Figure 4:
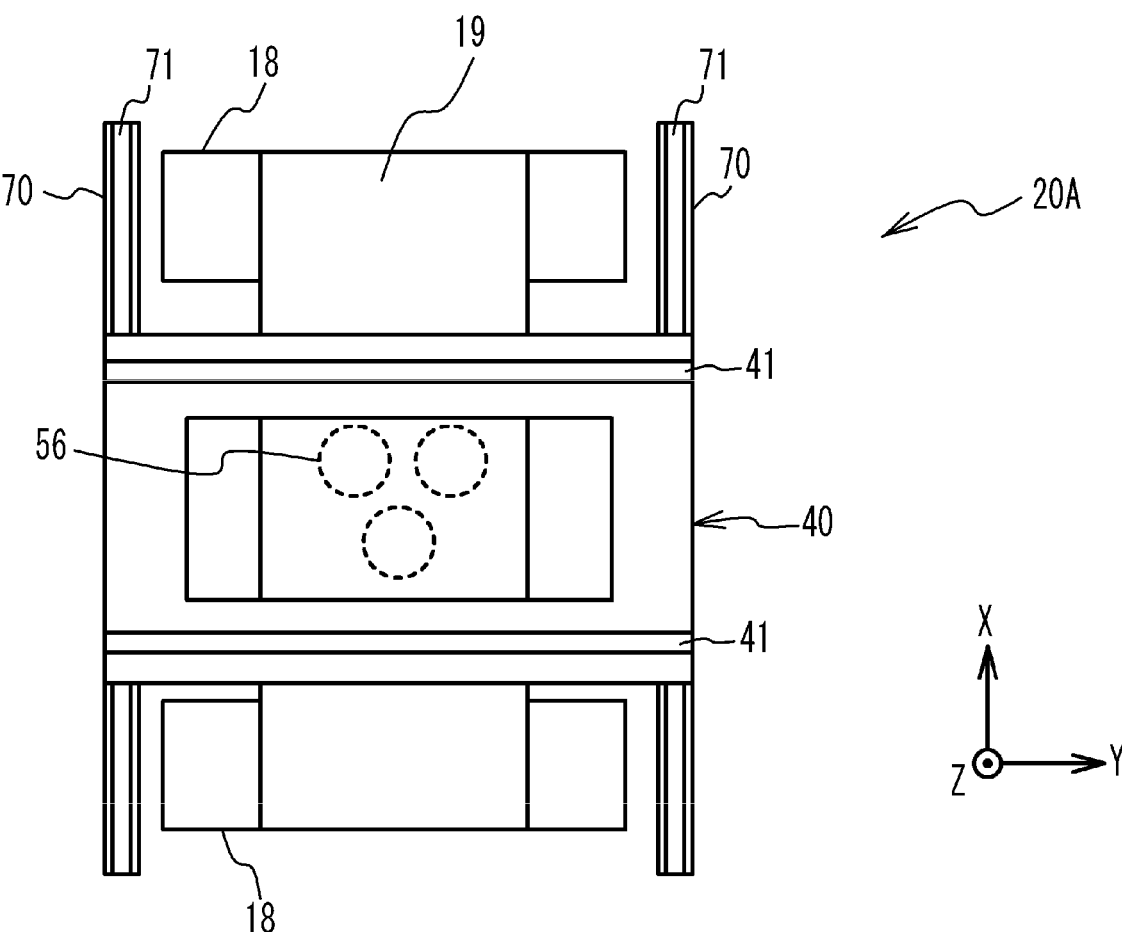
FIG. 4 is a plan view of the plate stage apparatus excluding the fine-adjustment stage and a Y coarse-adjustment stage.

In the first embodiment, the support mechanism 53A includes, for example, a so-called gas spring 531 filled with high-pressure gas inside an outer frame made of rubber. As illustrated in FIG. 2, the gas spring 531 has a predetermined thickness, the upper end portion of the gas spring 531 is connected to the plate stage 52A through a connecting portion 522, and the lower end portion of the gas spring 531 is connected to a support portion 533 disposed above the surface plate 19 in a non-contact manner. Gas bearings (hereinafter referred to as base pads) 56 having a bearing surface facing the −Z side are attached to the lower surface of the support portion 533. In FIG. 3B and FIG. 4, the base pads 56 are indicated by broken lines. Thus, the plate stage 52A is supported by the surface plate 19 through the support mechanism 53A in a non-contact manner. Although three gas bearings 56 are provided in the present embodiment, the number of the gas bearings 56 is not limited to three and may be one or more.

The gas spring 531 may be, for example, a bellows-type gas spring as illustrated in FIG. 1 and FIG. 2, or a diaphragm-type gas spring. A gas valve is connected to the gas spring 531, and varies its internal pressure in response to a change in the mounted load or the like. Thus, the upward force in the direction of gravity generated by the gas spring 531 is balanced with the weight (the downward force in the direction of gravity) of the system including the holding device 55A.

In the first embodiment, the support mechanism 53A generates an upward force in the direction of gravity by varying the internal pressure of the gas spring 531, that is, by varying the volume of air in the gas spring, but this does not intend to suggest any limitation. For example, a compression spring or the like may be used instead of the gas spring 531 as long as it is configured to be elastically deformed in accordance with a change in the orientation of the holding device 55A. In addition, the compression spring may be constituted by a single spring or a plurality of springs.

The gas spring 531 has degrees of freedom of movement in the X-axis direction, the Y-axis direction, the Z-axis direction, the θx direction, the θy direction, and the θz direction. That is, the gas spring 531 is deformed in accordance with a change in the angle between the upper surface of the plate holder 51A and the upper surface of the surface plate 19 (a change in the orientation of the holding device 55A with respect to the upper surface of the surface plate 19), that is, a swing (tilt) of the holding device 55A in the θx and Oy directions. For example, when the holding device 55A becomes, from a predetermined state, in a state in which the holding device 55A is rotated by a predetermined angle in the θx direction (a state in which the holding device 55A is rotated about the X-axis), a first side (for example, the +Y side) of the gas spring 531 contracts and a second side (for example, the −Y side) extends, so that the gas spring 531 deforms in accordance with a change in the orientation of the holding device 55A. Since the fine-adjustment stage 50A does not have a mechanical center of rotation, the fine-adjustment stage 50A swings (tilts) around the center of gravity G. The angle between the upper surface of the plate holder 51A and the upper surface of the surface plate 19 is an angle of intersection between a plane obtained by extending the upper surface of the plate holder 51A toward the surface plate 19 and a plane including the upper surface of the surface plate 19.

Here, the deformation of the gas spring 531 with respect to a change in the angle between the upper surface of the plate holder 51A and the upper surface of the surface plate 19 (a change in the orientation of the holding device 55A with respect to the upper surface of the surface plate 19) will be described in more detail.

As the angle between the upper surface of the plate holder 51A and the upper surface of the surface plate 19 changes, the gas spring 531 elastically deforms so that the thickness (the thickness in the direction of gravity) at a first side where the interval between the upper surface of the plate holder 51A and the upper surface of the surface plate 19 is narrow becomes small and the thickness at a second side where the interval between the upper surface of the plate holder 51A and the upper surface of the surface plate 19 is wide becomes large, thereby supporting the holding device 55A. That is, the gas spring 531 changes the height in the direction of gravity at different positions (a position where the interval between the upper surface of the plate holder 51A and the upper surface of the surface plate 19 is narrow and a position where the interval is large) in the direction orthogonal to the direction of gravity in response to a change in the orientation of the holding device 55A. This means that the gas spring 531 changes its height distribution in response to a change in the orientation of the holding device 55A. The angle between the upper surface of the plate holder 51A and the upper surface of the surface plate 19 includes 0 degree at which the upper surface of the plate holder 51A is parallel to the upper surface of the surface plate 19.

Since the height of the gas spring 531 at a position where the interval between the upper surface of the plate holder 51A and the upper surface of the surface plate 19 is narrow is different from the height of the gas spring 531 at a position where the interval is wide, the restoring forces of the gas spring 531 are different between these positions. Therefore, the gas spring 531 supports the holding device 55A with different forces at a position where the interval between the upper surface of the plate holder 51A and the upper surface of the surface plate 19 is narrow and a position where the interval is wide in accordance with a change in the angle between the upper surface of the plate holder 51A and the upper surface of the surface plate 19.

In addition, the gas spring 531 causes the ratio of the heights in the direction of gravity of the gas spring 531 at positions different from each other in the direction orthogonal to the direction of gravity to be different between the case in which the holding device 55A is in a predetermined state and the case in which the holding device 55A is in another state. Specifically, for example, in a state in which the upper surface of the plate holder 51A is parallel to the upper surface of the surface plate 19, when the heights of the gas spring 531 in the direction of gravity at positions different from each other in the direction orthogonal to the direction of gravity are L1 and L2 (L1=L2), respectively, the ratio of the heights in the direction of gravity (e.g., L1/L2) is 1. Here, when the upper surface of the plate holder 51A is rotated by a predetermined angle in the θx direction, the gas spring 531 deforms, and the heights of the gas spring 531 in the direction of gravity at the different positions become, for example, L1' (<L1) and L2' (>L2), respectively, and the ratio of the heights in the direction of gravity (L1'/L2') becomes less than 1. As described above, the gas spring 531 changes its ratio of the heights in the direction of gravity in response to a change in the orientation of the holding device 55A with respect to the surface plate 19. Although the ratio of the heights in the direction of gravity has been described using the state in which the upper surface of the plate holder 51A is parallel to the upper surface of the surface plate 19 as a reference, this does not intend to suggest any limitation.

Since the gas spring 531 deforms as described above, the upper surface of the plate holder 51A can freely move in the Z-axis direction and the θx and Oy directions.

As illustrated in FIG. 1 and FIG. 2, the plate stage 52A has a hermetic structure that is hollow and has ribs inside the plate stage 52A in order to achieve light weight and high rigidity. In the first embodiment, the inside of the plate stage 52A and the inside of the gas spring 531 are connected by the hollow connecting portion 522, thereby causing the plate stage 52A to function as a tank for the gas spring 531. This configuration can reduce the spring constant of the gas spring 531, and the vibration isolation performance of the support mechanism 53A can be improved.

Figure 5A:
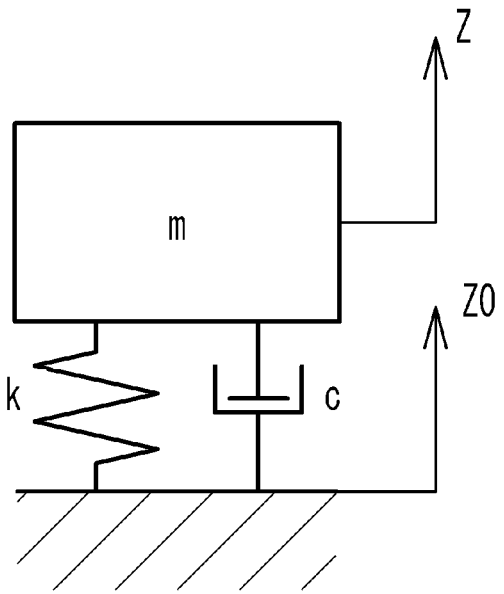
FIG. 5A and FIG. 5B are views for describing vibration isolation performance of a gas spring.
Figure 5B:
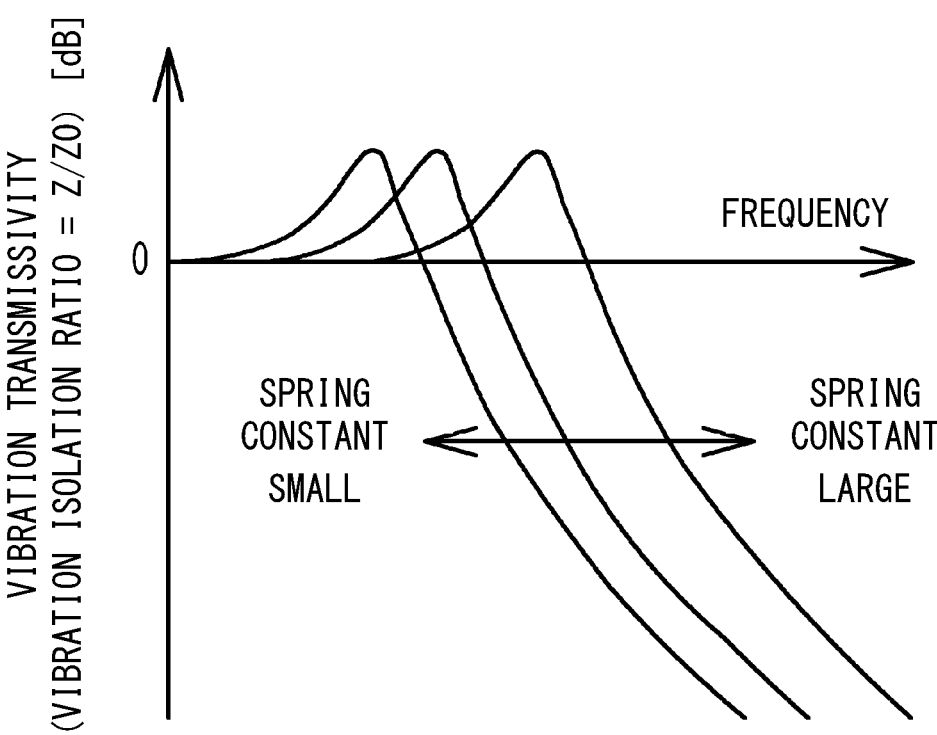

FIG. 5A and FIG. 5B are views for describing the vibration isolation performance of the gas spring. In FIG. 5A, k represents a spring constant, c represents a damping coefficient, and m represents a mass. In addition, Z0 represents the displacement of the floor, and Z represents the displacement of the mass.

When the mass is mounted on the spring as illustrated in FIG. 5A, it follows the disturbance entering from the installation surface of the spring without delay in the frequency band lower than the natural frequency of the spring, amplifies the vibration in the frequency band near the natural frequency (the vibration transmissibility is greater than 0), and attenuates the vibration in the frequency band higher than the natural frequency (the vibration transmissibility is less than 0) as illustrated in FIG. 5B. As the spring constant decreases, the vibration isolation region increases and the vibration isolation ratio improves.

Figure 6:
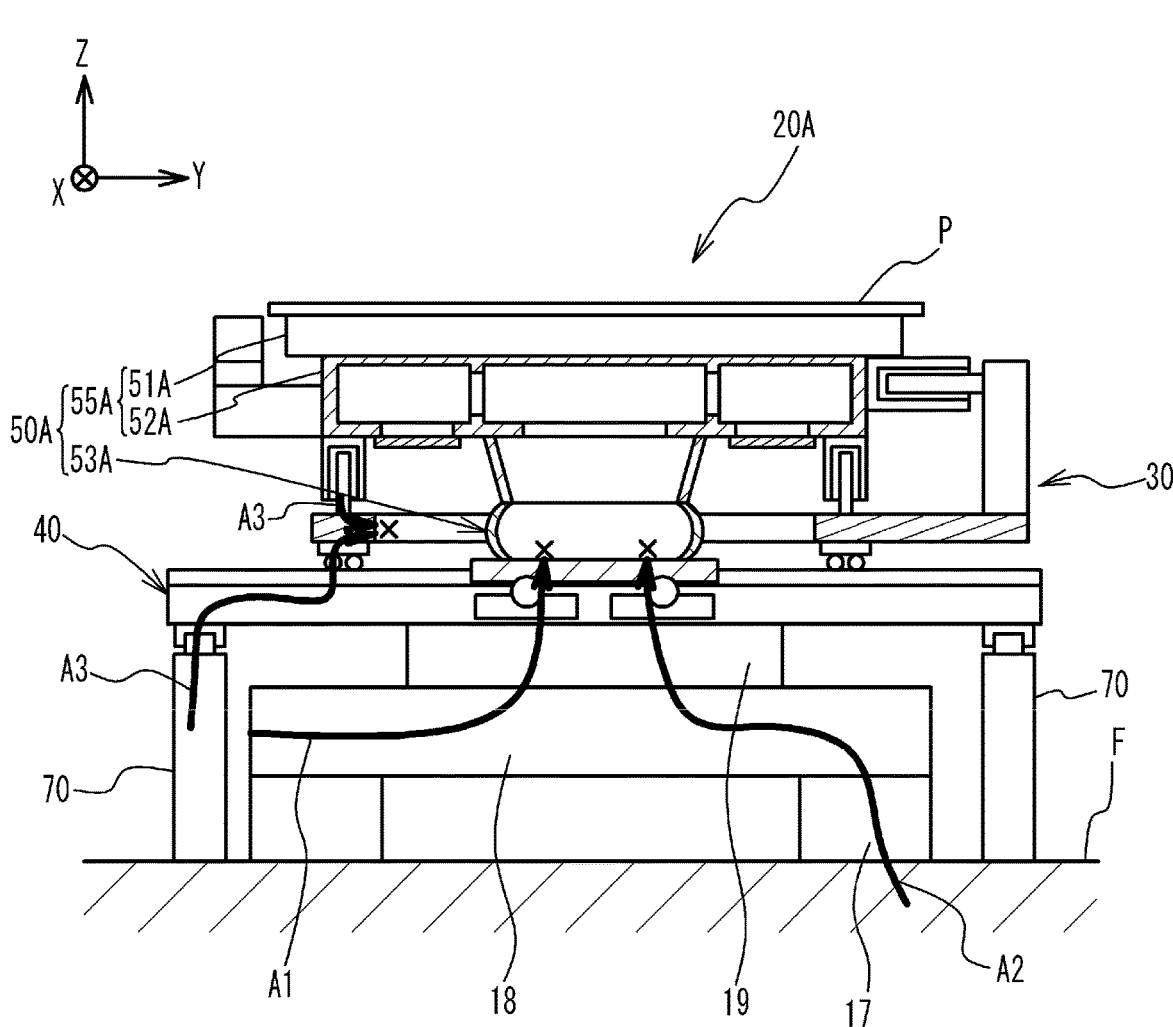
FIG. 6 is a view for describing transmission of disturbance to the fine-adjustment stage.

In the first embodiment, since the plate stage 52A functions as a tank for the gas spring 531, the spring constant of the gas spring 531 can be reduced. Since the weight of the fine-adjustment stage 50A is supported by the gas spring 531 having a small spring constant, the support mechanism 53A has high vibration isolation performance. As a result, as illustrated in FIG. 6, it is possible to effectively attenuate the disturbance (see an arrow A1) transmitted from other units in the exposure apparatus 10A to the fine-adjustment stage 50A and the disturbance (see an arrow A2) transmitted from the outside of the exposure apparatus 10A to the fine-adjustment stage 50A. Thus, the controllability of the fine-adjustment stage 50A can be improved.

Since gas is always supplied to the gas spring 531 by the gas valve, the hermeticity of the plate stage 52A does not have to be strict, and for example, the plate stage 52A may be made of a cast metal, and the cast hole may be closed with lids 521 as illustrated in FIG. 1 and FIG. 2.

Referring back to FIG. 1, the X coarse-adjustment stage 40 is placed below (at the −Z side of) the fine-adjustment stage 50A and on a pair of the base frames 70 through a pair of linear guide devices 71. As illustrated in FIG. 4, the X coarse-adjustment stage 40 is formed of a plate-like member having a rectangular shape in a plan view, and has an opening formed in the center thereof. A pair of linear guide devices 41 are provided in both end portions of the X coarse-adjustment stage 40 in the X-axis direction.

The Y coarse-adjustment stage 30 is disposed above (at the +Z side of) the X coarse-adjustment stage 40 and below the fine-adjustment stage 50A (between the fine-adjustment stage 50A and the X coarse-adjustment stage 40). As illustrated in FIG. 3B, the Y coarse-adjustment stage 30 is formed of a plate-like member having a rectangular shape in a plan view, and has an opening formed in the center thereof. The Y coarse-adjustment stage 30 is mounted on the X coarse-adjustment stage 40 through the pair of the linear guide devices 41 included in the X coarse-adjustment stage 40, and is movable in the Y-axis direction with respect to the X coarse-adjustment stage 40, but moves integrally with the X coarse-adjustment stage 40 in the X-axis direction.

The plate drive system includes a first drive system for finely driving the fine-adjustment stage 50A in directions of six degrees of freedom (the X-axis, Y-axis, Z-axis, θx, θy, and θz directions) with respect to the surface plate 19, a second drive system for driving the X coarse-adjustment stage 40 on the base frames 70 in the X-axis direction with a long stroke, and a third drive system for driving the Y coarse-adjustment stage 30 on the X coarse-adjustment stage 40 in the Y-axis direction with a long stroke. The types of actuators constituting the second drive system and the third drive system are not particularly limited, but as an example, a linear motor, a ball screw drive device, or the like can be used. The driving forces with which the X coarse-adjustment stage 40 and the Y coarse-adjustment stage 30 are driven by the second drive system and the third drive system are applied to the fine-adjustment stage 50A through voice coil motors constituting the first drive system described later. The fine-adjustment stage 50A is moved in the X-axis direction by a driving force with which the X coarse-adjustment stage 40 is moved in the X-axis direction by the second drive system. Further, the fine-adjustment stage 50A is moved in the Y-axis direction by a driving force with which the Y coarse-adjustment stage 30 is moved in the Y-axis direction by the third drive system.

Although the type of the actuator constituting the first drive system is not particularly limited. For example, in FIG. 2, a plurality of voice coil motors are illustrated as thrust applying devices that generate a thrust force in each of the X-axis, Y-axis, and Z-axis directions.

The plurality of voice coil motors include X voice coil motors 61X (see FIG. 3A) for finely driving the holding device 55A in the X-axis direction, Y voice coil motors 61Y (see FIG. 2 and FIG. 3A) for finely driving the holding device 55A in the Y-axis direction, and a plurality of Z voice coil motors 61Z (see FIG. 2) for finely driving the holding device 55A in the three-degree-of-freedom directions: the θx, θy, and Z-axis directions. In each of the voice coil motors 61X, 61Y, 61Z, the fixed elements are attached to the Y coarse-adjustment stage 30, and the movable elements are attached to the plate stage 52A of the holding device 55A.

As illustrated in FIG. 3A, a pair of the X voice coil motors 61X are provided to be spaced apart from each other in the Y-axis direction, and a pair of the Y voice coil motors 61Y are provided to be spaced apart from each other in the X-axis direction. As illustrated in FIG. 2, the X voice coil motors 61X and the Y voice coil motors 61Y are attached to the Y coarse-adjustment stage 30 and the fine-adjustment stage 50A at a position substantially aligned with the center of gravity G of the fine-adjustment stage 50A in the Z-axis direction so as not to generate a moment on the fine-adjustment stage 50A. As a result, the fine-adjustment stage 50A can be translated (horizontally moved in the X-axis direction and/or the Y-axis direction) by the center-of-gravity driving. As described above, the fine-adjustment stage 50A swings (tilts, rotationally moves) around the center of gravity G. Therefore, the fine-adjustment stage 50A can be translated and rotated by the center-of-gravity driving. If the fine-adjustment stage 50A has a mechanical center of rotation, there is a possibility that the center of rotation does not coincide with the center of gravity. In this case, the point with respect to which the translational movement of the fine-adjustment stage 50A is performed and the point with respect to which the rotational movement of the fine-adjustment stage 50A is performed are different (the translational movement is performed with respect to the center of gravity G and the rotational movement is performed with respect to the mechanical center of rotation), and controllability of driving the stage therefore deteriorates. On the other hand, since the translational movement and the rotational movement of the fine-adjustment stage 50A are performed with respect to the same center of gravity G, the controllability of driving the stage can be improved.

The plurality of the Z voice coil motors 61Z are arranged at positions corresponding to the four corners of the bottom surface of the plate stage 52A (in FIG. 2, only two of the four Z voice coil motors 61Z are illustrated, and the other two are not illustrated). The number of the Z voice coil motors 61Z is not limited to four, and may be three, five or more.

Thrust forces are applied (transmitted) to the fine-adjustment stage 50A (the holding device 55A) in directions of six degrees of freedom with respect to the Y coarse-adjustment stage 30 through the voice coil motors 61X, 61Y, and 61Z. The position and orientation of the fine-adjustment stage 50A are changed by thrust forces from the voice coil motors 61X, 61Y, and 61Z so that the projection image of the pattern on the mask M is formed on the plate P.

Even the surface of the plate P that appears to be flat has irregularities at the micro level. Because of the irregularities, there may be a case in which the projection image is not formed on the surface of the plate P. Further, for example, when the second exposure is performed on the plate P, the plate P may be deformed by the first exposure, and there may be a case in which the projection image is not formed on the surface of the plate P. Therefore, the Z voice coil motors 61Z adjust the Z position and the inclination angle (the angle between the upper surface of the plate holder 51A and the upper surface of the surface plate 19) of the fine-adjustment stage 50A (the holding device 55A) so that the imaging plane of the projection optical system 16 coincides with the upper surface of the plate P (the upper surface of the plate P falls within the range of the focal depth of the best imaging plane of the projection optical system 16). Although it has been described that the flatness of the upper surface of the surface plate 19 is finished to be very high, if the upper surface is deformed, the imaging plane of the projection optical system 16 and the surface of the plate P do not coincide with each other. In this case, the Z position and the inclination angle of the fine-adjustment stage 50A are adjusted by the Z voice coil motors 61Z.

Detailed configurations of the first to third drive systems are disclosed in, for example, U.S. Patent Application Publication No. 2010/0018950, and thus description thereof is omitted. The movable element attached to the plate stage 52A and the fixed element attached to the Y coarse-adjustment stage 30 are connected in a non-contact manner, and can apply the generated thrust force to the fine-adjustment stage 50A.

As described above, in the first embodiment, since the fine-adjustment stage 50A is mechanically separated from (not mechanically connected to) the X coarse-adjustment stage 40 and the Y coarse-adjustment stage 30, it is possible to inhibit transmission of disturbance from the coarse-adjustment stages 30 and 40 to the fine-adjustment stage 50A (an arrow A3 in FIG. 6). Further, the pair of the base frames 70 supporting the X coarse-adjustment stage 40 are disposed on the floor (on the floor surface) F so as to be separated from the vibration isolation devices 17 supporting the fine-adjustment stage 50A, and it is possible to inhibit the disturbance generated in the coarse-adjustment stages 30 and 40 from being transmitted to the fine-adjustment stage 50A through the base frames 70 and the vibration isolation devices 17.

Referring back to FIG. 2, a Y moving mirror (a bar mirror) 58Y having a reflection surface orthogonal to the Y-axis is fixed to the −Y-side side surface of the plate stage 52A through a mirror base 57Y. As illustrated in FIG. 3A, an X moving mirror 58X having a reflection surface orthogonal to the X-axis is fixed to the +X-side side surface of the plate stage 52A through a mirror base 57X. Positional information of the fine-adjustment stage 50A in the XY plane is constantly detected with a resolution of, for example, about 0.5 to 1 nm by a laser interferometer system (hereinafter referred to as a plate interferometer system) 91 (see FIG. 2) using the X moving mirror 58X and the Y moving mirror 58Y. Although the plate interferometer system 91 actually includes a plurality of X laser interferometers corresponding to the X moving mirror 58X and a plurality of Y laser interferometers corresponding to the Y moving mirror 58Y, only the Y laser interferometer is representatively illustrated in FIG. 2. Each of the plurality of laser interferometers is fixed to the apparatus body. The positional information of the fine-adjustment stage 50A may be detected by, for example, a one dimensional or higher encoder instead of the laser interferometer.

Positional information of the fine-adjustment stage 50A in the Ox, Oy, and Z-axis directions is obtained by a sensor (Z sensor) (not illustrated) fixed to the lower surface of the plate stage 52A using, for example, a target fixed to the support portion 533. Since the configuration of the position measurement system of the fine-adjustment stage 50A is disclosed in, for example, U.S. Patent Application Publication No. 2010/0018950, detailed description thereof will be omitted.

As described above in detail, the plate stage apparatus 20A in accordance with the first embodiment includes the holding device 55A having a support surface (the upper surface of the plate holder 51A) for supporting the plate P, the support mechanism 53A that has a predetermined thickness, is elastically deformable, and supports the holding device 55A, the surface plate 19 having a support surface (the upper surface of the surface plate 19) that supports the support mechanism 53A, and the Z voice coil motor 61Z for moving the holding device 55A so that the angle between the upper surface of the plate holder 51A and the upper surface of the surface plate 19 is changed. The support mechanism 53A elastically deforms so that the thickness at a first side where the interval between the upper surface of the plate holder 51A and the upper surface of the surface plate 19 is narrow becomes small and the thickness at a second side where the interval between the upper surface of the plate holder 51A and the upper surface of the surface plate 19 is wide becomes large as the angle is changed by the Z voice coil motor 61Z to support the holding device 55A.

As described above, since the fine-adjustment stage 50A does not have a mechanical center of rotation, the fine-adjustment stage 50A swings (tilts) around the center of gravity G. Therefore, since the position of the rotation center of the fine-adjustment stage 50A coincides with the position of the center of gravity G serving as a reference for translational movement, the fine-adjustment stage 50A has high controllability, and the positioning accuracy of the fine-adjustment stage 50A is improved.

Further, in the first embodiment, the plate stage apparatus 20A includes the holding device 55A having a support surface (the upper surface of the plate holder 51A) for supporting the plate P, the support mechanism 53A that applies an upward force in the direction of gravity to the lower surface of the plate stage 52A and supports the holding device 55A, and the Z voice coil motor 61Z configured to move the holding device 55A so that the holding device 55A becomes, from a first state (for example, a state in which the upper surface of the plate holder 51A is parallel to the upper surface of the surface plate 19), in a second state in which the inclination angle of the upper surface of the plate holder 51A is changed. The support mechanism 53A supports the holding device 55A that becomes in the second state with mutually different forces at mutually different positions in the direction intersecting the direction of gravity on the lower surface of the plate stage 52A. This configuration improves the positioning accuracy of the fine-adjustment stage 50A in the same manner as described above.

Further, in the first embodiment, the plate stage apparatus 20A includes the holding device 55A having a support surface (the upper surface of the plate holder 51A) for supporting the plate P, the surface plate 19 having a support surface that supports the holding device 55A, and the support mechanism 53A that is disposed between the holding device 55A and the surface plate 19 in the direction of gravity, supports the holding device 55A, is thin at a first side where the interval between the upper surface of the plate holder 51A and the upper surface of the surface plate 19 is narrow, and is thick at a second side where the interval between the upper surface of the plate holder 51A and the upper surface of the surface plate 19 is wide. This configuration improves the positioning accuracy of the fine-adjustment stage 50A in the same manner as described above.

Further, in the first embodiment, the plate stage apparatus 20A includes the holding device 55A on which the plate P is placed, the support mechanism 53A that supports the holding device 55A from below, and the Z voice coil motor 61Z that drives the holding device 55A to change the orientation of the holding device 55A from a first state (for example, a state in which the holding device 55A is not tilted in the Ox direction) to a second state (a state in which the holding device 55A is rotated by a predetermined angle in the θx direction). The support mechanism 53A includes the gas spring 531 elastically deformable with respect to a load applied from the holding device 55A to the support mechanism 53A, and the gas spring 531 changes a height distribution of the gas spring 531 in accordance with a change in the orientation of the holding device 55A caused by the Z voice coil motor 61Z. This configuration improves the positioning accuracy of the fine-adjustment stage 50A in the same manner as described above. The distribution of height may be a distribution of thickness or a distribution of elastic force.

Further, in the first embodiment, the plate stage apparatus 20A includes the holding device 55A on which the plate P is placed, the support mechanism 53A that supports the holding device 55A from below, and the Z voice coil motor 61Z that drives the holding device 55A to change the orientation of the holding device 55A from a first state (for example, a state in which the holding device 55A is not tilted in the Ox direction) to a second state (a state in which the holding device 55A is rotated by a predetermined angle in the θx direction). The support mechanism 53A includes the gas spring 531 elastically deformable with respect to a load applied from the holding device 55A to the support mechanism 53A, and the gas spring 531 changes heights of the gas spring 531 in the direction of gravity at positions different from each other in a direction orthogonal to the direction of gravity to heights different from each other in accordance with a change in the orientation of the holding device 55A caused by the Z voice coil motor 61Z. This configuration improves the positioning accuracy of the fine-adjustment stage 50A in the same manner as described above. The height in the direction of gravity may be a thickness in the direction of gravity or an elastic force in the direction of gravity.

Further, in the first embodiment, the plate stage apparatus 20A includes the holding device 55A on which the plate P is placed, the support mechanism 53A that supports the holding device 55A from below, and the Z voice coil motor 61Z that drives the holding device 55A to change the orientation of the holding device 55A from a first state (for example, a state in which the holding device 55A is not tilted in the Ox direction) to a second state (a state in which the holding device 55A is rotated by a predetermined angle in the θx direction). The support mechanism 53A includes the gas spring 531 elastically deformable with respect to a load applied from the holding device 55A to the support mechanism 53A, and the gas spring 531 causes a ratio of heights in the direction of gravity of the gas spring 531 at positions different from each other in a direction orthogonal to the direction of gravity to be different between the first state and the second state. This configuration improves the positioning accuracy of the fine-adjustment stage 50A in the same manner as described above. The ratio of heights may be a ratio of thicknesses in the direction of gravity or a ratio of elastic forces in the direction of gravity.

In the first embodiment, the support mechanism 53A is connected to the holding device 55A. Since the holding device 55A and the support mechanism 53A are connected and integrated, when the holding device 55A is moved, the support mechanism 53A is also moved. Therefore, it is not necessary to provide a component for moving the support mechanism 53A separately from the component for moving the holding device 55A. The holding device 55A is moved through a voice coil motor in which a fixed element and a movable element are connected in a non-contact manner. The holding device 55A and the coarse-adjustment stages 30 and 40 are not mechanically connected to each other, so that it is possible to inhibit transmission of disturbance from the coarse-adjustment stages 30 and 40 to the fine-adjustment stage 50A.

In the first embodiment, the plate stage apparatus 20A includes the Y coarse-adjustment stage 30 and the X coarse-adjustment stage 40 that move the holding device 55A supported by the support mechanism 53A relative to the surface plate 19, and the voice coil motors 61X, 61Y, and 61Z that include fixed elements provided to the Y coarse-adjustment stage 30 and movable elements provided to the holding device 55A and move the holding device 55A relative to the Y coarse-adjustment stage 30 and the X coarse-adjustment stage 40 through the movable elements and the fixed elements arranged in a non-contact manner. This configuration can move the plate P to a desired position, and the imaging plane of the projection optical system 16 and the surface of the plate P can be made to coincide with each other.

In the first embodiment, the voice coil motors 61X, 61Y, and 61Z transmit the driving force with which the holding device 55A is moved relative to the surface plate 19 by the Y coarse-adjustment stage 30 and the X coarse-adjustment stage 40 to the holding device 55A through the movable elements and the fixed elements. Since the fine-adjustment stage 50A can be connected to the Y coarse-adjustment stage 30 and the X coarse-adjustment stage 40 in a non-contact manner by the fixed elements and the movable elements, it is possible to inhibit the vibration of the Y coarse-adjustment stage 30 and the X coarse-adjustment stage 40 from being transmitted to the fine-adjustment stage 50A.

When the holding device 55A and the support mechanism 53A are mechanically separated from each other and the support mechanism 53A is pulled by the Y coarse-adjustment stage 30, the vibration of the Y coarse-adjustment stage 30 may be transmitted to the support mechanism 53A. Since, for example, a target of the Z sensor is provided in the support portion 533 of the support mechanism 53A, when vibration is transmitted to the support mechanism 53A, measurement of the Z sensor is affected. Therefore, it is necessary to consider the influence of vibration transmission to the support mechanism 53A, and it is difficult to simulate the motion of the fine-adjustment stage with respect to control in the fine-adjustment stage in which the plate stage 52A and the support mechanism 53A are mechanically separated from each other.

On the other hand, in the fine-adjustment stage 50A of the first embodiment, the holding device 55A and the support mechanism 53A are connected and integrated, and the vibration of the Y coarse-adjustment stage 30 is not transmitted to the support mechanism 53A. Therefore, since the vibration of the Y coarse-adjustment stage 30 does not affect the measurement of the Z sensor, it is easy to simulate the motion of the fine-adjustment stage with respect to the control in the fine-adjustment stage 50A.

When the fine-adjustment stage has a rotation mechanism for rotating the plate stage in the θx direction and the θy direction, for example, it is necessary to reduce the rigidity of the fine-adjustment stage (specifically, to make the center portion thin and place the rotation mechanism as high as possible) in order to align the center of rotation with the position of the center of gravity of the fine-adjustment stage. On the other hand, in the first embodiment, since it is not necessary to provide a rotation mechanism, the rigidity of the plate stage can be increased, and the flatness of the plate holder can be improved. Furthermore, by increasing the rigidity of the plate stage, the positioning accuracy of the plate stage can also be improved.

Further, since the support mechanism 53A supports (cancels) the weight of the fine-adjustment stage 50A, the thrust force of the Z voice coil motor 61Z required to drive the plate stage 52A in the Z-axis direction, the θx direction, and the θy direction can be reduced. As a result, the amount of heat generated by the Z voice coil motor 61Z can be reduced, so that temperature fluctuation due to heat generation by the Z voice coil motor 61Z can be reduced. Although the temperature fluctuation affects the position measurement, since the temperature fluctuation is reduced in the first embodiment, the accuracy of the position measurement can be improved.

In the first embodiment, the support mechanism 53A is the gas spring 531 filled with gas. Since the gas spring 531 is the only component of the support mechanism 53A, the height of the fine-adjustment stage 50A can be reduced easily and inexpensively. In addition, since the support mechanism 53A is small, the weight of the fine-adjustment stage 50A can be reduced, and since the rigidity of the gas spring 531 is small, the plate stage 52A can be tilt-driven with a small thrust force, so that the amount of heat generated by the voice coil motors 61X, 61Y, and 61Z can be reduced. As a result, it is possible to inhibit performance deterioration of the exposure apparatus 10A due to heat.

In the first embodiment, the plate stage 52A is hollow, and the inside of the plate stage 52A and the inside of the gas spring 531 are communicated with each other. Thus, since the plate stage 52A functions as a tank for the gas spring 531, the spring constant of the gas spring 531 can be reduced, and the vibration isolation performance of the gas spring 531 can be improved.

Furthermore, since the spring constant of the gas spring 531 is small, when the plate stage 52A is driven in the Z-axis direction, the θx direction, and the θz direction, only a small thrust is required to counteract the restoring force of the spring, and the thrust force of the voice coil motor for driving in the Z-axis direction, the θx direction, and the θy direction can be reduced. As a result, the amount of heat generated by the voice coil motor can be reduced, and the thermal influence on the exposure apparatus 10A can be reduced.

Further, in the first embodiment, some elements (for example, the fixed elements) of the voice coil motors 61X and 61Y that apply a thrust force in at least one of the X-axis and Y-axis directions to the holding device 55A are provided to the Y coarse-adjustment stage 30 at positions that substantially coincide with the center of gravity G of the fine-adjustment stage 50A including the holding device 55A and the support mechanism 53A in the Z-axis direction. Thus, as for the X-axis direction and the Y-axis direction, the positions of the thrust generation points of the voice coil motors 61X and 61Y in the Z-axis direction substantially coincide with the center of gravity G of the fine-adjustment stage 50A. Therefore, as for the X-axis direction and the Y-axis direction, the fine-adjustment stage 50A can be driven without interfering with movements in other directions. That is, when the fine-adjustment stage 50A is driven in the X-axis direction, for example, the fine-adjustment stage 50A can be driven in the X-axis direction without interfering with the movement in the θy direction. When the fine-adjustment stage 50A is driven in the Y-axis direction, the fine-adjustment stage 50A can be driven in the Y-axis direction without interfering with the movement in the θx direction, for example.

As for the Z-axis direction, the Z voice coil motor 61Z generates a thrust force while maintaining a balance of moments, so that the fine-adjustment stage 50A can be driven without interfering with other axes. As for the θz direction, by applying a moment in that direction to the fine-adjustment stage 50A, the fine-adjustment stage 50A moves around the center of gravity G so as to be most stable. Since the motion of the gas spring 531 is not restricted in the θx direction and the θy direction, the plate stage 52A moves around the center of gravity G so as to be most stable by applying a moment in that direction to the plate stage 52A. As described above, since there is no interference between the axes, the positioning accuracy of the fine-adjustment stage 50A can be improved.

In the first embodiment, the Z voice coil motor 61Z rotationally moves the fine-adjustment stage 50A with the center of gravity G as the center of rotation. As a result, since the translational movement and the rotational movement of the fine-adjustment stage 50A are performed with respect to the same center of gravity G, the controllability of driving the stage can be improved.

Variation 1

Figure 7A:
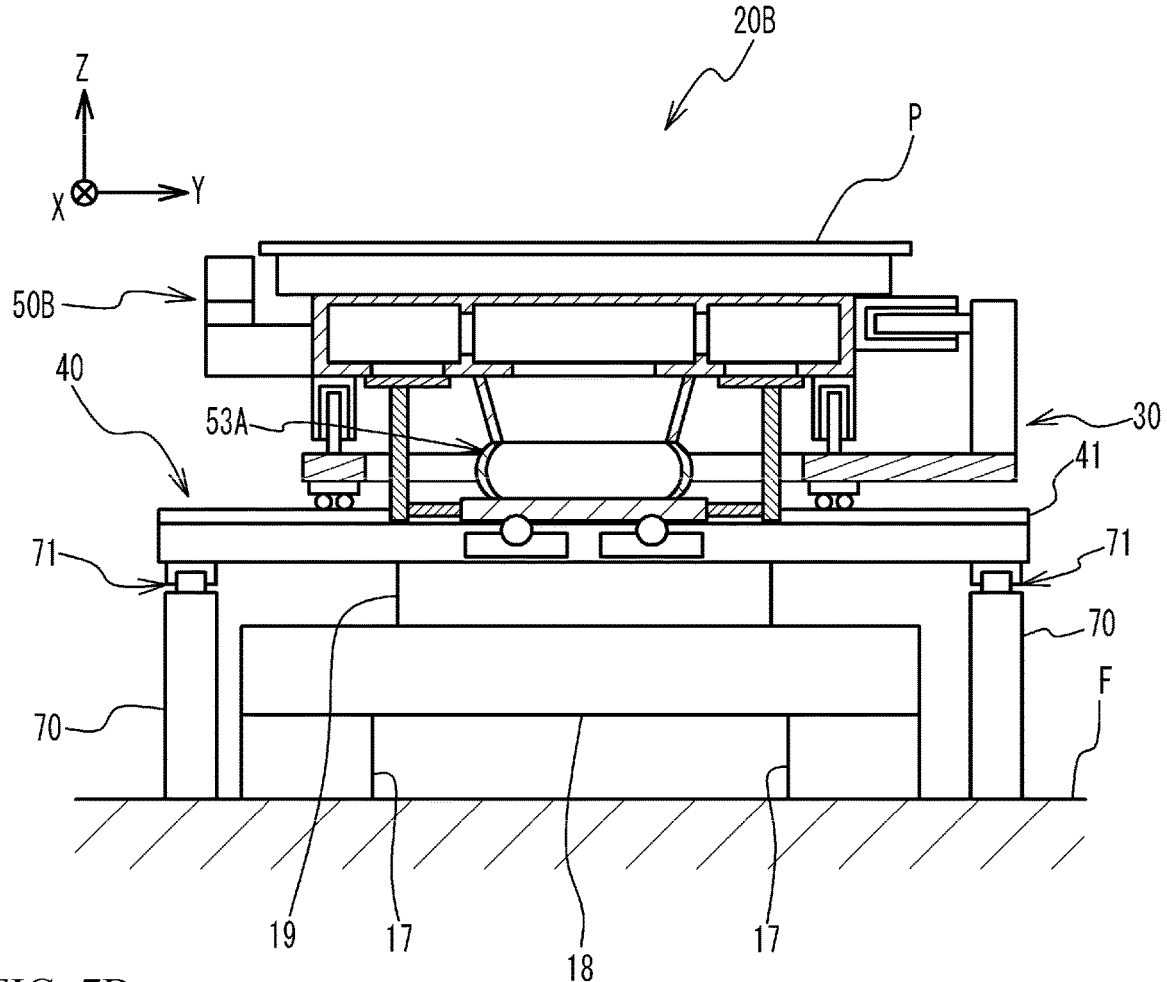
FIG. 7A illustrates a configuration of a plate stage apparatus in accordance with a variation 1 of the first embodiment.
Figure 7B:
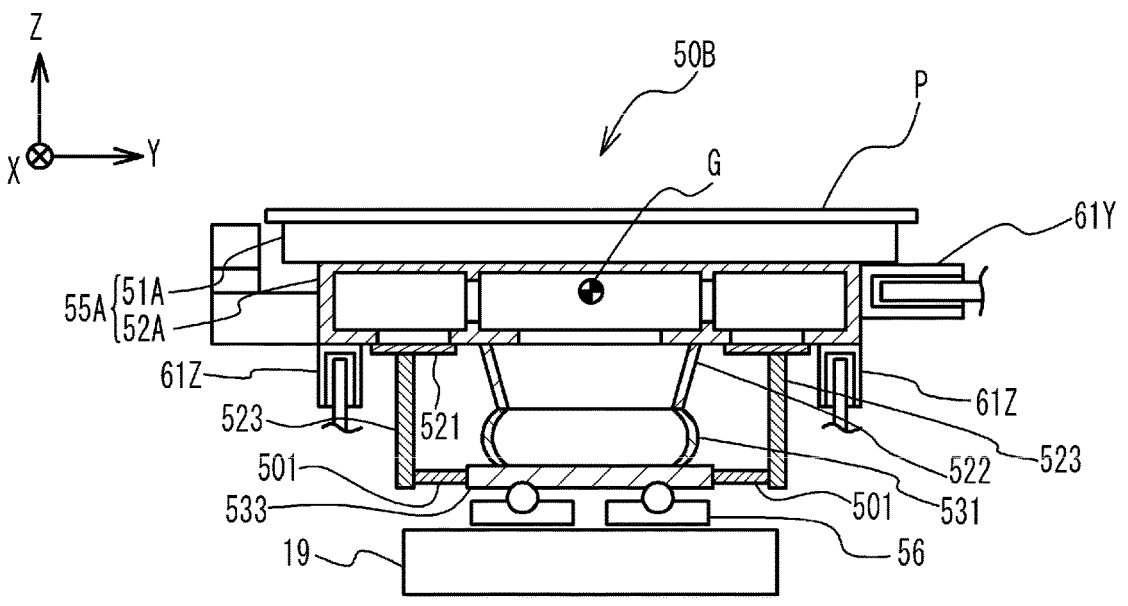
FIG. 7B illustrates a fine-adjustment stage in accordance with the variation 1.

FIG. 7A illustrates a configuration of a plate stage apparatus 20B in accordance with a variation 1 of the first embodiment, and FIG. 7B illustrates a fine-adjustment stage 50B in accordance with the variation 1.

As illustrated in FIG. 7B, the fine-adjustment stage 50B of the variation 1 includes leaf springs 501. A first end of the leaf spring 501 is connected to a lower end portion of a connecting member 523 extending from the lower surface of the plate stage 52A in the direction of gravity (the Z-axis direction), and a second end thereof is connected to the support portion 533. The leaf spring 501 is disposed so that its thickness direction is parallel to a direction (i.e., the Z-axis direction) orthogonal to the upper surface of the surface plate 19 (the movement reference plane of the fine-adjustment stage 50B). Since other configurations are the same as those of the first embodiment, detailed description thereof will be omitted.

The fine-adjustment stage 50B in accordance with the variation 1 of the first embodiment includes the leaf spring 501 that has a first end connected to the plate stage 52A and a second end connected to the support portion 533 and is disposed so that its thickness direction is parallel to the Z-axis direction. The leaf spring 501 installed in this manner has high rigidity in the X-axis direction and the Y-axis direction, and low rigidity in the Z-axis direction. Therefore, the leaf spring 501 does not hinder the driving of the fine-adjustment stage 50B in the θx direction and the θy direction. On the other hand, the leaf spring 501 improves the followability of the support mechanism 53A to the plate stage 52A, and can increase the natural frequency of the lower portion of the gas spring 531. Therefore, even when the support mechanism 53A is shaken by disturbance, since the amplitude is small, the force (excitation force) transmitted to the exposure apparatus 10A through the surface plate 19 becomes small, and the performance of the exposure apparatus 10A as a whole is improved.

Variation 2

Although the plate stage 52A functions as a tank for the gas spring 531 in the first embodiment and the variation 1 thereof, this does not intend to suggest any limitation.

Figure 8:
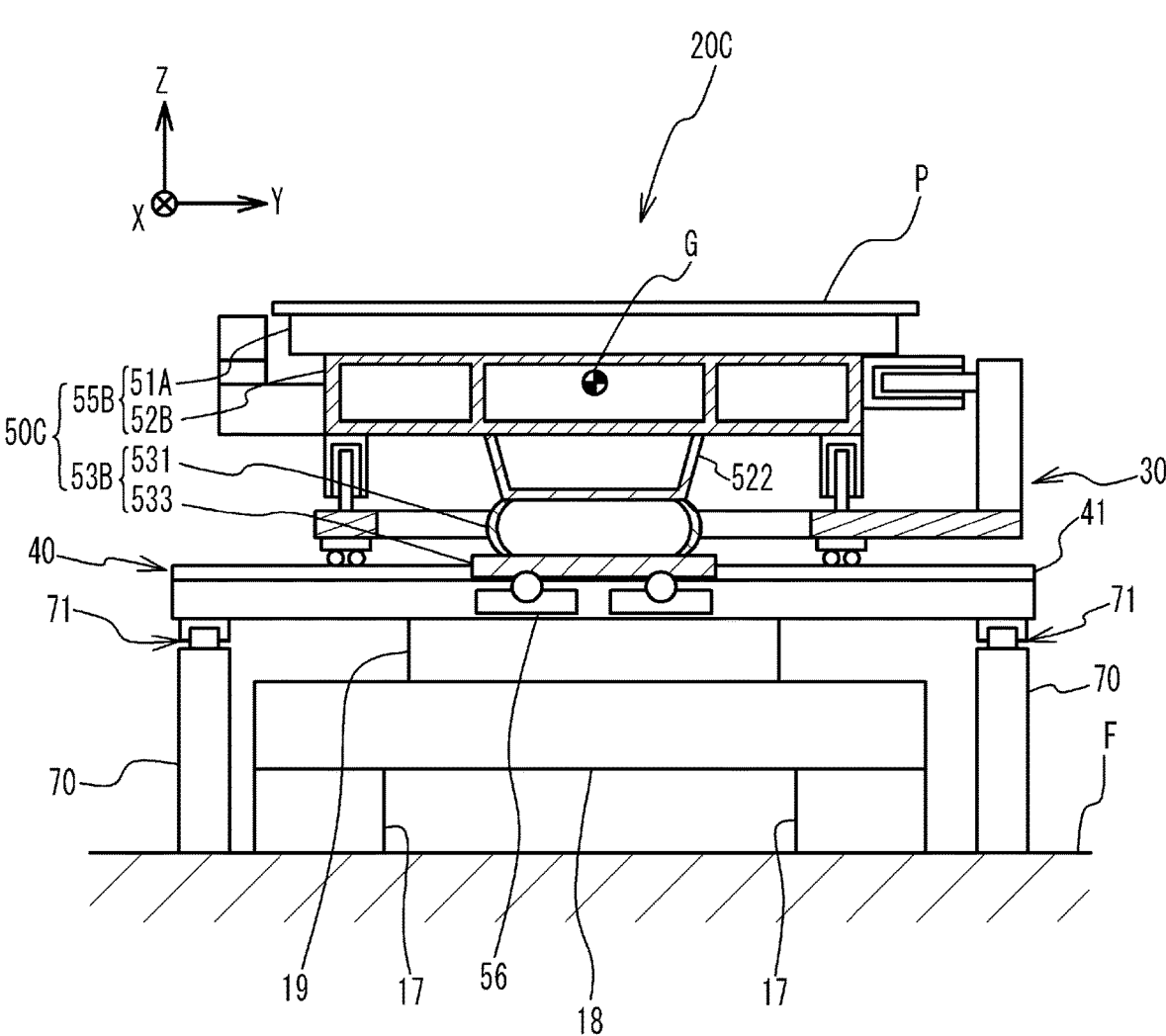
FIG. 8 schematically illustrates a configuration of a plate stage apparatus in accordance with a variation 2 of the first embodiment.

FIG. 8 schematically illustrates a configuration of a plate stage apparatus 20C in accordance with a variation 2 of the first embodiment. As illustrated in FIG. 8, in the variation 2, the inside of the gas spring 531 of a support mechanism 53B and the inside of a plate stage 52B of a holding device 55B are not communicated with each other, and only the gas spring 531 functions as a tank. Since other configurations are the same as those of the first embodiment, detailed description thereof will be omitted.

When the plate stage 52B is not used as a tank for the gas spring 531, the spring constant of the gas spring 531 is larger than when the plate stage 52B is used as a tank, but a fine-adjustment stage 50C can be configured more easily. In addition, since the tank becomes small, the amount of gas to be supplied with respect to the internal pressure fluctuation of the gas spring 531 can be reduced.

In the variation 2, the upper end portion of the gas spring 531 is connected to the plate stage 52B through the connecting portion 522, but the connecting portion 522 may be omitted and the gas spring 531 may be directly connected to the plate stage 52B. The same applies not only to the variation 2 of the first embodiment but also to other embodiments and variations thereof.

Variation 3-1

Figure 9A:
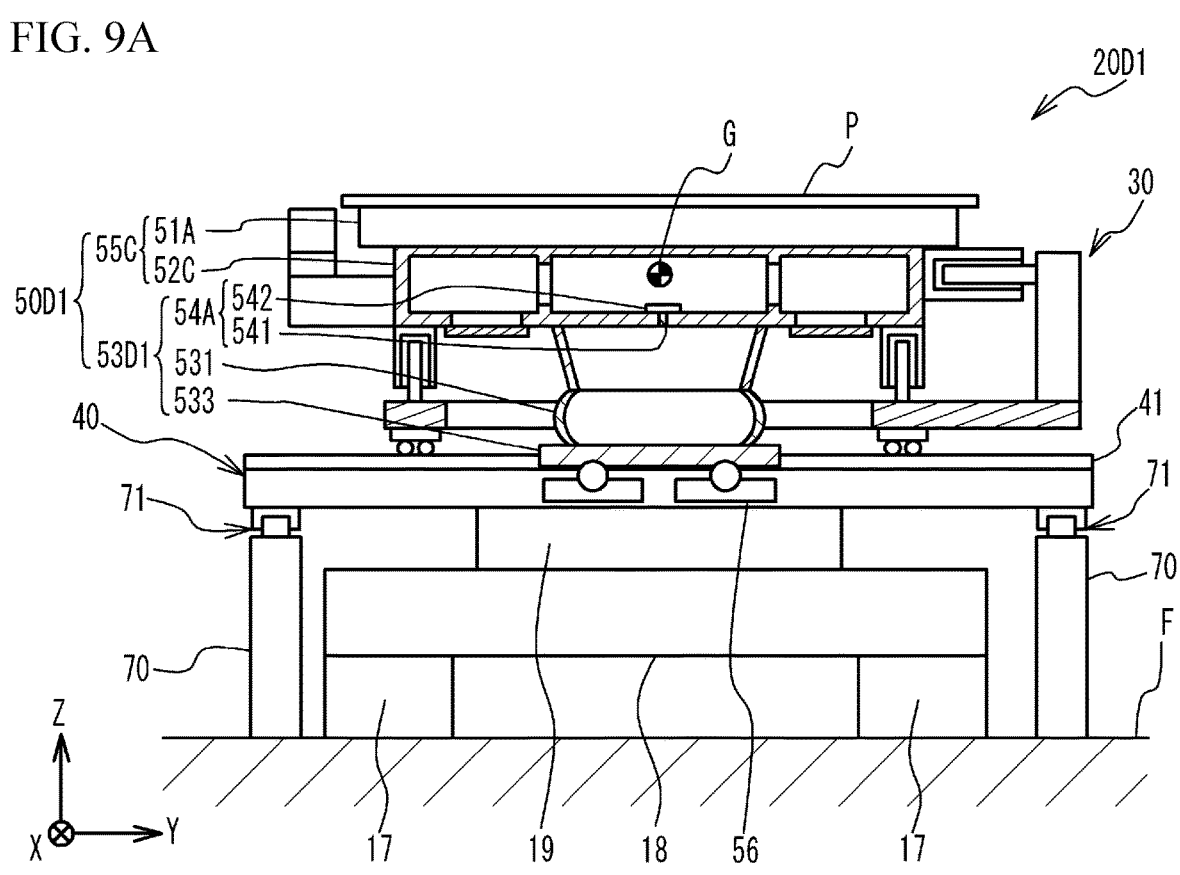
FIG. 9A illustrates a configuration of a plate stage apparatus in accordance with a variation 3-1 of the first embodiment, and FIG. 9B schematically illustrates a configuration of a plate stage apparatus in accordance with a variation 3-2 of the first embodiment.

FIG. 9A illustrates a configuration of a plate stage apparatus 20D1 in accordance with a variation 3-1. In the plate stage apparatus 20D1 in accordance with the variation 3-1, a support mechanism 53D1 includes a damping mechanism 54A in addition to the gas spring 531. The damping mechanism 54A generates a damping force in a direction (the Z-axis direction) perpendicular to the movement reference plane (the XY plane).

In the variation 3-1, the damping mechanism 54A includes a throttle 541 formed in a plate stage 52C of a holding device 55C and a pressure-loss element 542. When the gas spring 531 deforms, gas flows back and forth between the inside (tank) of the plate stage 52C and the inside of the gas spring 531, and a damping action can be obtained by the pressure-loss of the gas passing through the throttle 541. Thereby, the disturbance transmitted to a fine-adjustment stage 50D1 can be further attenuated.

The pressure-loss element 542 is, for example, a filter, and is arranged in series with the throttle 541 as illustrated in FIG. 9A. The pressure loss element 542 attenuates piping resonance caused by the throttle 541. Alternatively, the pressure-loss element 542 may be omitted. Since other configurations are the same as those of the first embodiment, detailed description thereof will be omitted.

Since the throttle 541 is formed on the lower surface of the plate stage 52C and the pressure-loss element 542 is provided inside the plate stage 52C (inside the tank), it is possible to further attenuate the disturbance transmitted to the fine-adjustment stage 50D1 without increasing the size of the support mechanism 53D1, that is, without increasing the size of the fine-adjustment stage 50D1.

Variation 3-2

Figure 9B:
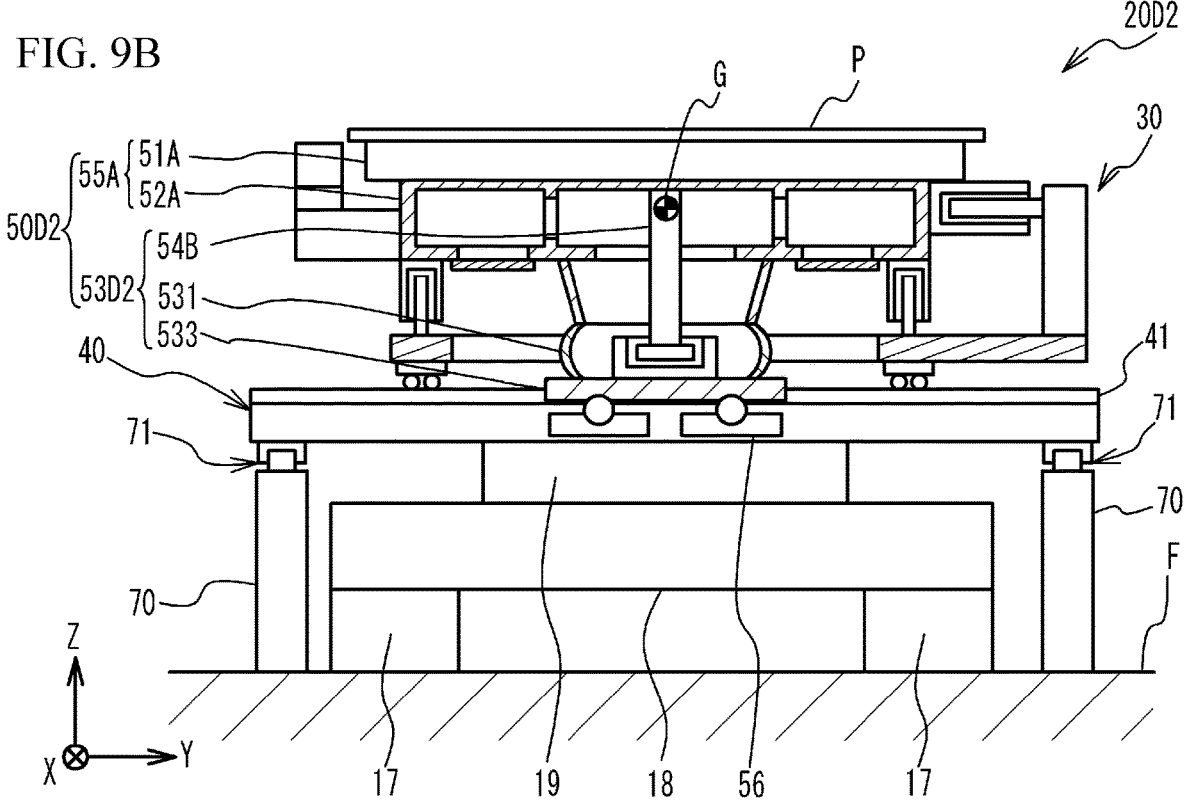

FIG. 9B schematically illustrates a configuration of a plate stage apparatus 20D2 in accordance with a variation 3-2 of the first embodiment. In the plate stage apparatus 20D2 in accordance with the variation 3-2, a support mechanism 53D2 includes a damper mechanism 54B as a damping mechanism in addition to the gas spring 531. This makes it possible to further attenuate the disturbance transmitted to the fine-adjustment stage 50D2. Since other configurations are the same as those of the first embodiment, detailed description thereof will be omitted.

Since the damper mechanism 54B can be installed inside the tank formed by the gas spring 531 and the plate stage 52A, the disturbance transmitted to a fine-adjustment stage 50D2 can be further attenuated without increasing the size of the support mechanism 53D2, that is, without increasing the size of the fine-adjustment stage 50D2.

Variation 4

Figure 10:
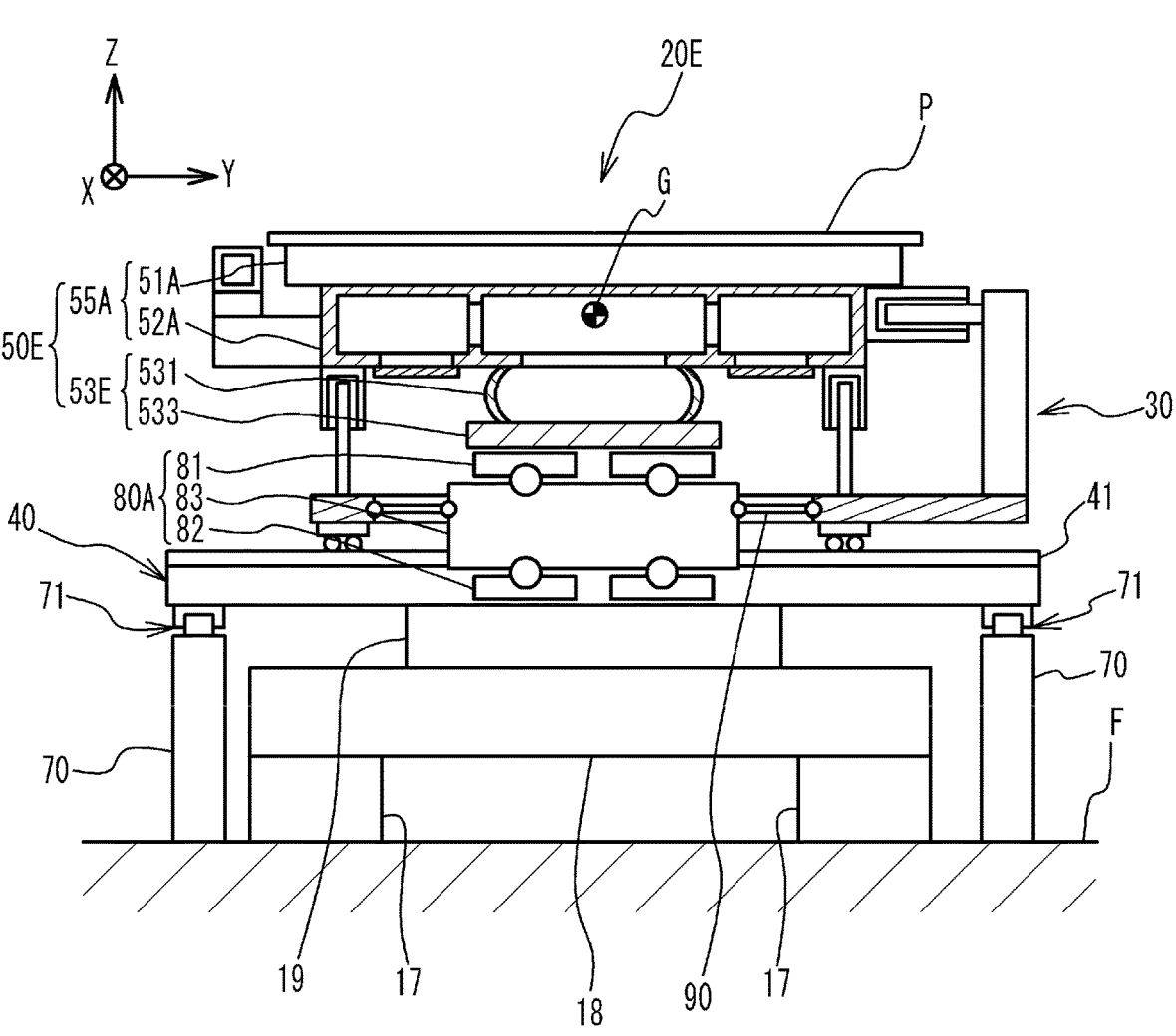
FIG. 10 schematically illustrates a configuration of a plate stage apparatus in accordance with a variation 4 of the first embodiment.

FIG. 10 schematically illustrates a configuration of a plate stage apparatus 20E in accordance with a variation 4 of the first embodiment. As illustrated in FIG. 10, the plate stage apparatus 20E in accordance with the variation 4 includes a fine-adjustment stage support mechanism 80A that supports a fine-adjustment stage 50E.

The fine-adjustment stage support mechanism 80A includes a table portion 83 and gas bearings 81 and 82. The table portion 83 is inserted into an opening (see FIG. 3B) formed in the Y coarse-adjustment stage 30. The table portion 83 is mechanically connected to the Y coarse-adjustment stage 30 through a plurality of connection devices 90 (also referred to as flexure devices), and when the table portion 83 is pulled by the Y coarse-adjustment stage 30, the fine-adjustment stage support mechanism 80A moves along the XY plane integrally with the Y coarse-adjustment stage 30.

The gas bearings 82 with a bearing surface facing the –Z side are attached to the lower surface (the surface at the –Z side) of the table portion 83. As a result, the fine-adjustment stage support mechanism 80A is placed in a non-contact state through the gas bearings 82 on the surface plate 19 whose upper surface is finished to have very high flatness. The gas bearings 81 (referred to as sealing pads) with a bearing surface facing the +Z side are attached to the upper surface (the surface at the +Z side) of the table portion 83.

Further, in the variation 4, the lower surface of the support portion 533 supporting the gas spring 531 is finished to have very high flatness, and functions as a guide surface for the above-described sealing pads 81 of the fine-adjustment stage support mechanism 80A.

In the variation 4, the gas spring 531 of a support mechanism 53E is directly connected to the plate stage 52A, and the inside of the plate stage 52A and the inside of the gas spring 531 are communicated with each other. Since other configurations are the same as those of the first embodiment, detailed description thereof will be omitted.

Even when the fine-adjustment stage 50E of the variation 4 is adopted, the same effect as that of the first embodiment can be obtained. In the variation 4, the plate stage 52A and the support portion 533 may be connected by a leaf spring as in the variation 1. Thereby, it is possible to obtain the same effect as that of the variation 1. In the variation 4, similarly to the variation 2, the inside of the plate stage 52A and the inside of the gas spring 531 do not have to be communicated with each other. In the variation 4, similarly to the variations 3-1 and 3-2, the support mechanism 53E may include the damping mechanism 54A or the damper mechanism 54B in addition to the gas spring 531.

Variation 5

Figure 11:
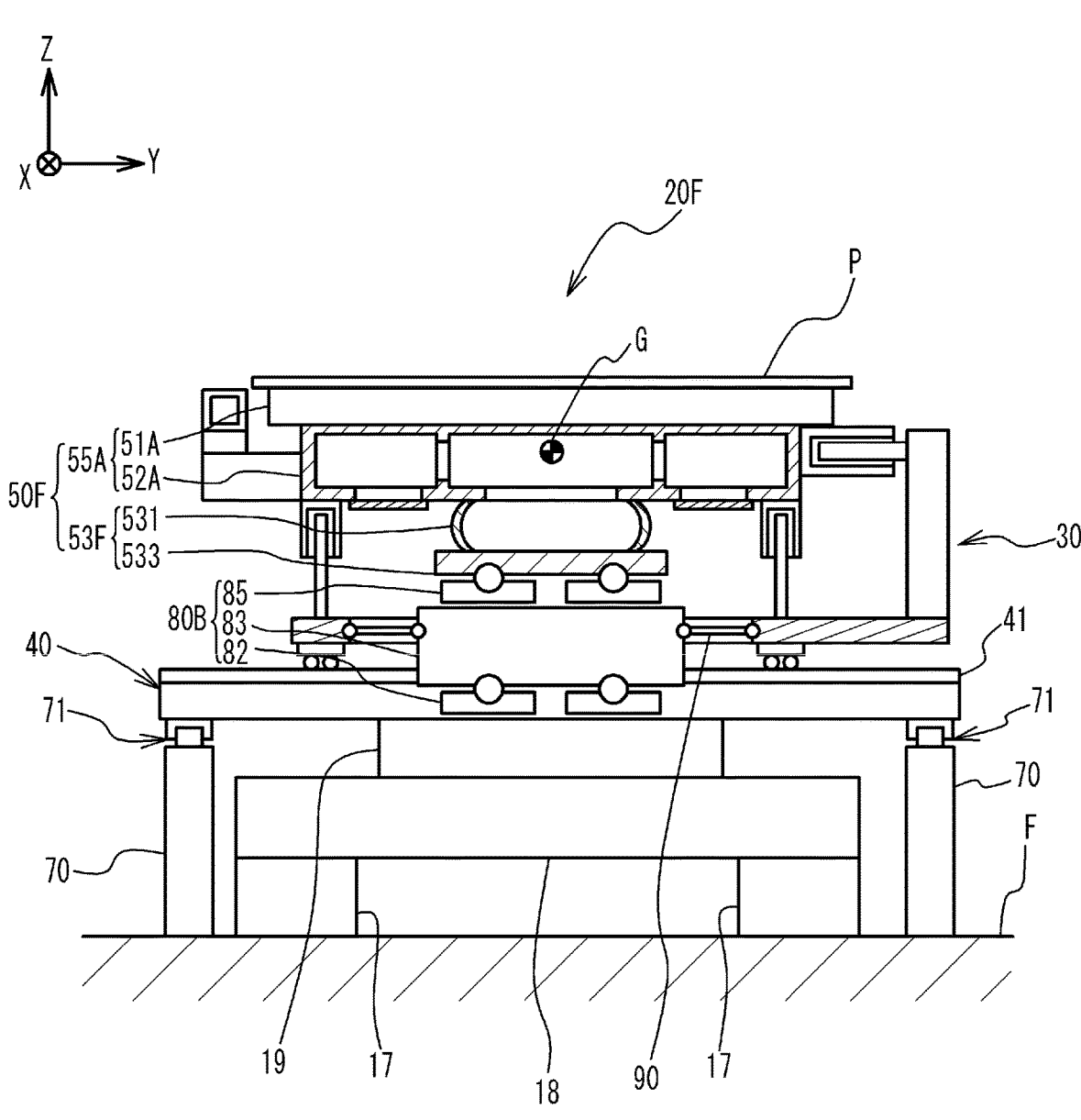
FIG. 11 schematically illustrates a configuration of a plate stage apparatus in accordance with a variation 5 of the first embodiment.

FIG. 11 schematically illustrates a configuration of a plate stage apparatus 20F in accordance with a variation 5 of the first embodiment. In the variation 5, the upper surface (the surface at the +Z side) of the table portion 83 of a fine-adjustment stage support mechanism 80B functions as the guide surface for a fine-adjustment stage 50F, and gas bearings 85 with a bearing surface facing the –Z side are attached between the table portion 83 and the support portion 533 of a support mechanism 53F. Since other configurations are the same as those of the variation 4, detailed description thereof will be omitted. Even when the fine-adjustment stage 50F of the variation 5 is adopted, the same effect as that of the first embodiment can be obtained.

Variation 6

Although the support mechanisms 53A, 53B, 53D1, 53D2, 53E, and 53F in the first embodiment and the variations 1 to 5 thereof include the gas spring 531, the support mechanisms may have other configurations.

Figure 12:
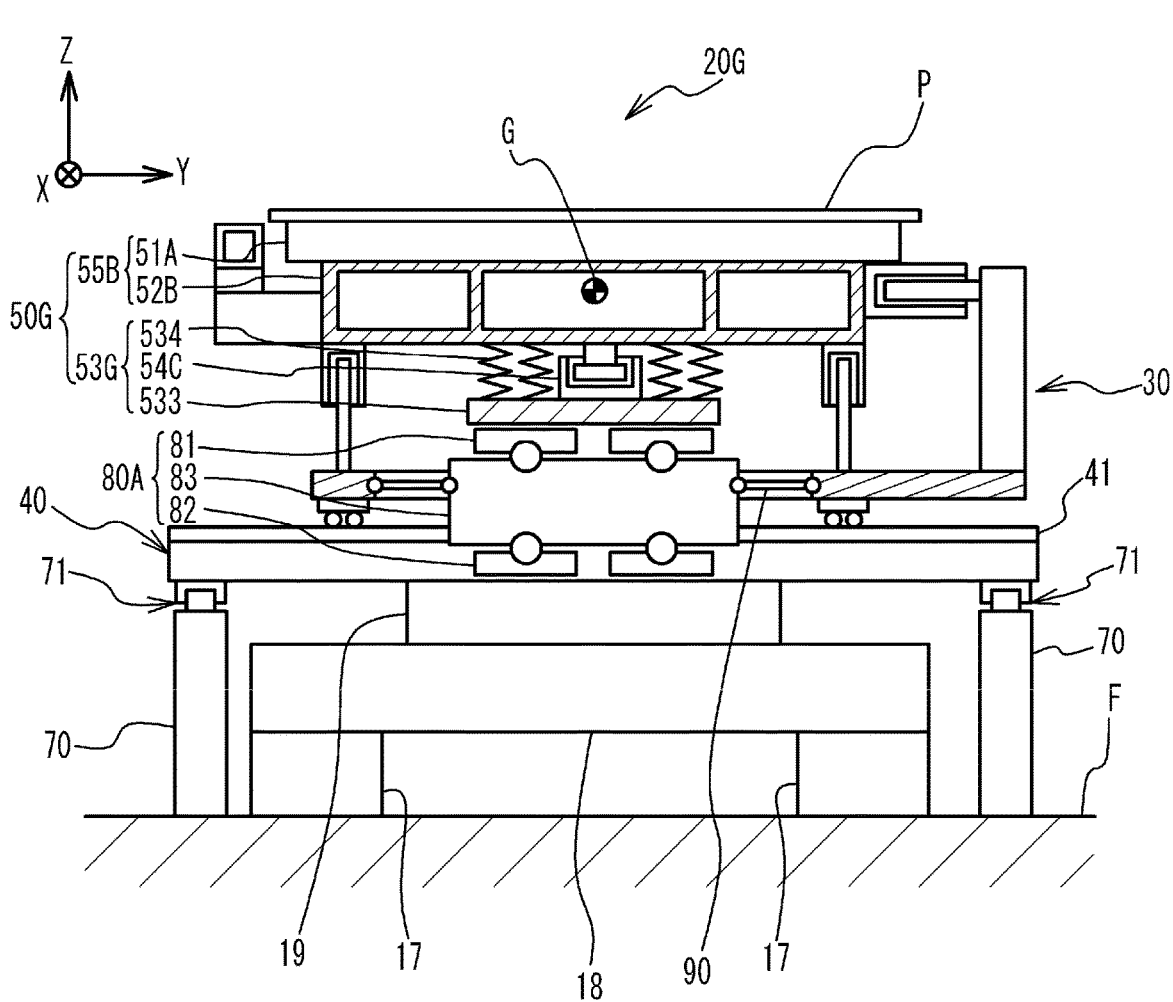
FIG. 12 schematically illustrates a configuration of a plate stage apparatus in accordance with a variation 6 of the first embodiment.

FIG. 12 schematically illustrates a configuration of a plate stage apparatus 20G in accordance with a variation 6 of the first embodiment. As illustrated in FIG. 12, a support mechanism 53G of a fine-adjustment stage 50G in accordance with the variation 6 includes a plurality of coil springs 534 and a damping mechanism 54C.

The plurality of the coil springs 534 are arranged at different positions in the lower surface of the plate stage 52B, first ends of the coil springs 534 are fixed to the lower surface of the plate stage 52B, and second ends of the coil springs 534 are fixed to the support portion 533. The plurality of the coil springs 534 are deformed according to a change in the orientation of the holding device 55B with respect to the upper surface of the surface plate 19, that is, the swing (tilt) of the holding device 55B in the θx and θy directions. For example, when the holding device 55B rotates by a predetermined angle in the θx direction (rotates about the X-axis) from a predetermined state, one coil spring 534 (for example, the coil spring 534 provided closer to the +Y side than to the center of the holding device 55B in the Y-axis direction) contracts, and another coil spring 534 (for example, the coil spring 534 provided closer to the −Y side than to the center of the holding device 55B in the Y-axis direction) expands.

That is, the plurality of the coil springs 534 support the holding device 55B by elastically deforming so that the height in the direction of gravity of the coil spring 534 positioned at a first side where the interval between the upper surface of the plate holder 51A and the upper surface of the surface plate 19 is narrow decreases and the height in the direction of gravity of the coil spring 534 positioned at a second side where the interval between the upper surface of the plate holder 51A and the upper surface of the surface plate 19 is wide increases as the angle between the upper surface of the plate holder 51A and the upper surface of the surface plate 19 changes.

Since the heights of the coil springs 534 are different between the position where the interval between the upper surface of the plate holder 51A and the upper surface of the surface plate 19 is narrow and the position where the interval is wide, the restoring forces of the coil springs 534 differ. Therefore, the plurality of the coil springs 534 arranged at different positions in the lower surface of the plate stage 52B support the holding device 55B with different forces at a position where the interval between the upper surface of the plate holder 51A and the upper surface of the surface plate 19 is narrow and at a position where the interval is wide in accordance with a change in the angle between the upper surface of the plate holder 51A and the upper surface of the surface plate 19.

The damping mechanism 54C generates a damping force in a direction (the Z-axis direction) perpendicular to the movement reference plane (the XY plane). Since other configurations are the same as those of the variation 4, detailed description thereof will be omitted.

The plate stage apparatus 20G of the variation 6 includes the holding device 55B having a supporting surface (the upper surface of the plate holder 51A) for supporting the plate P, the support mechanism 53G having a plurality of elastically deformable coil springs 534 that support the holding device 55B from below, the surface plate 19 having a supporting surface that supports the support mechanism 53G, and the Z voice coil motor 61Z that moves the holding device 55B so that the angle between the upper surface of the plate holder 51A and the upper surface of the surface plate 19 is changed. In accordance with a change in the angle caused by the Z voice coil motor, the support mechanism 53G elastically deforms so that the coil spring 534 supporting a first side where the interval between the upper surface of the plate holder 51A and the upper surface of the surface plate 19 is narrow contracts and the coil spring 534 supporting a second side where the interval between the upper surface of the plate holder 51A and the upper surface of the surface plate 19 is wide expands to support the holding device 55B. As described above, even when the coil spring 534 is used instead of the gas spring 531, the same effect as that of the first embodiment can be obtained.

When the coil spring 534 is used, the spring constant is larger than that of the gas spring, but the support mechanism 53G can be easily configured. Also, energy consumption can be reduced because no tank is required. In addition, disturbance transmitted to the fine-adjustment stage 50G can be attenuated by the damping mechanism 54C. The damping mechanism 54C is preferably a damper mechanism using a viscous fluid, a solid damper using a viscoelastic body, or the like.

Second Embodiment

Although the fine-adjustment stage of the first embodiment can be tilted in the θx direction and the θy direction, the fine-adjustment stage of a second embodiment does not tilt in the θx direction or the θy direction.

Figure 13:
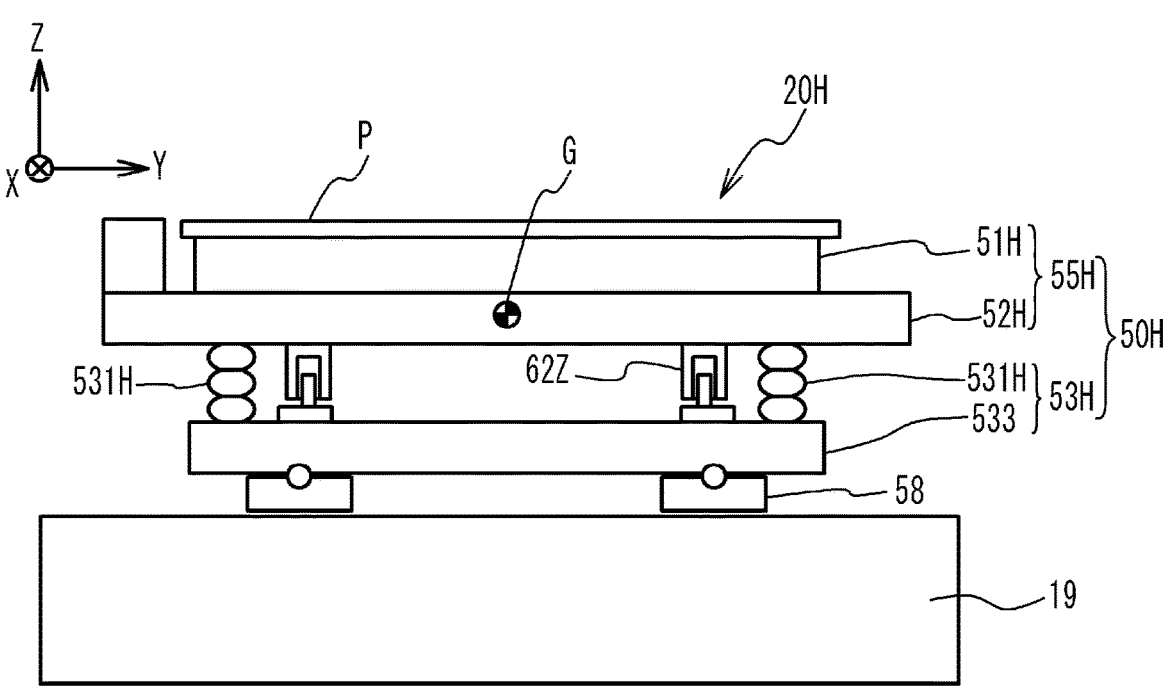
FIG. 13 schematically illustrates a configuration of a plate stage apparatus in accordance with a second embodiment.

FIG. 13 schematically illustrates a configuration of a plate stage apparatus 20H in accordance with the second embodiment. The plate stage apparatus 20H includes the surface plate 19 and a fine-adjustment stage 50H.

The fine-adjustment stage 50H is disposed on the surface plate 19. The fine-adjustment stage 50H includes a holding device 55H including a plate holder 51H and a plate stage 52H, a support mechanism 53H, and gas bearings 58.

The support mechanism 53H includes a plurality of (for example, three) gas springs 531H and the support portion 533. The plurality of the gas springs 531H are provided so as to surround the center of gravity G of the fine-adjustment stage 50H, and generate a force in the direction of gravity (the Z-axis direction) that balances with the weight of the system including a plate holder 51H and the plate stage 52H.

In the second embodiment, the fine-adjustment stage 50H includes Z voice coil motors 62Z for driving the plate stage 52H in the Z-axis direction. The movable element of the Z voice coil motor 62Z is attached to, for example, the lower surface of the plate stage 52H, and the fixed element thereof is attached to the upper surface of the support portion 533. The Z voice coil motor 62Z applies a thrust force to the plate stage 52H in the Z-axis direction. The Z voice coil motor 62Z has a Z guide (not illustrated) that restricts the driving direction of the plate stage 52H by the Z voice coil motor 62Z to the Z-axis direction. Thus, the fine-adjustment stage 50H cannot be tilted in the θx direction nor the θy direction. The Z voice coil motor 62Z that applies a thrust force to the plate stage 52H in the Z-axis direction and the Z guide that restricts the driving direction of the plate stage 52H to the Z-axis direction may be provided separately.

As described above, the plate stage apparatus 20H of the second embodiment includes the plate stage 52H that moves while holding the plate P, and the support mechanism 53H that is connected to the plate stage 52H and supports the plate stage 52H in a non-contact manner with respect to the movement reference plane in a direction (the Z-axis direction) orthogonal to the movement reference plane (the upper surface of the surface plate 19) serving as a reference when the plate stage 52H moves. The support mechanism 53H includes a plurality of the gas springs 531H whose upper ends are connected to the plate stage 52H and whose lower ends are connected to the support portion 533 disposed above the movement reference plane in a non-contact manner. Thus, as in the first embodiment and the variations 1 to 5 thereof, the disturbance transmitted from the surface plate 19 can be attenuated by the gas springs 531H.

In addition, since the weight of the holding device 55H is supported by the plurality of the gas springs 531H, the Z voice coil motor 62Z can drive the holding device 55H in the Z-axis direction with a small thrust force. As a result, the amount of heat generated by the Z voice coil motor 62Z can be reduced, and deterioration in position measurement accuracy due to temperature fluctuations can be inhibited.

Further, as compared with the case in which a ball screw driving device is used to drive the plate stage 52H in the Z-axis direction, the use of the Z voice coil motor 62Z can improve the position control accuracy of the fine-adjustment stage 50H.

Variation

Figure 14:
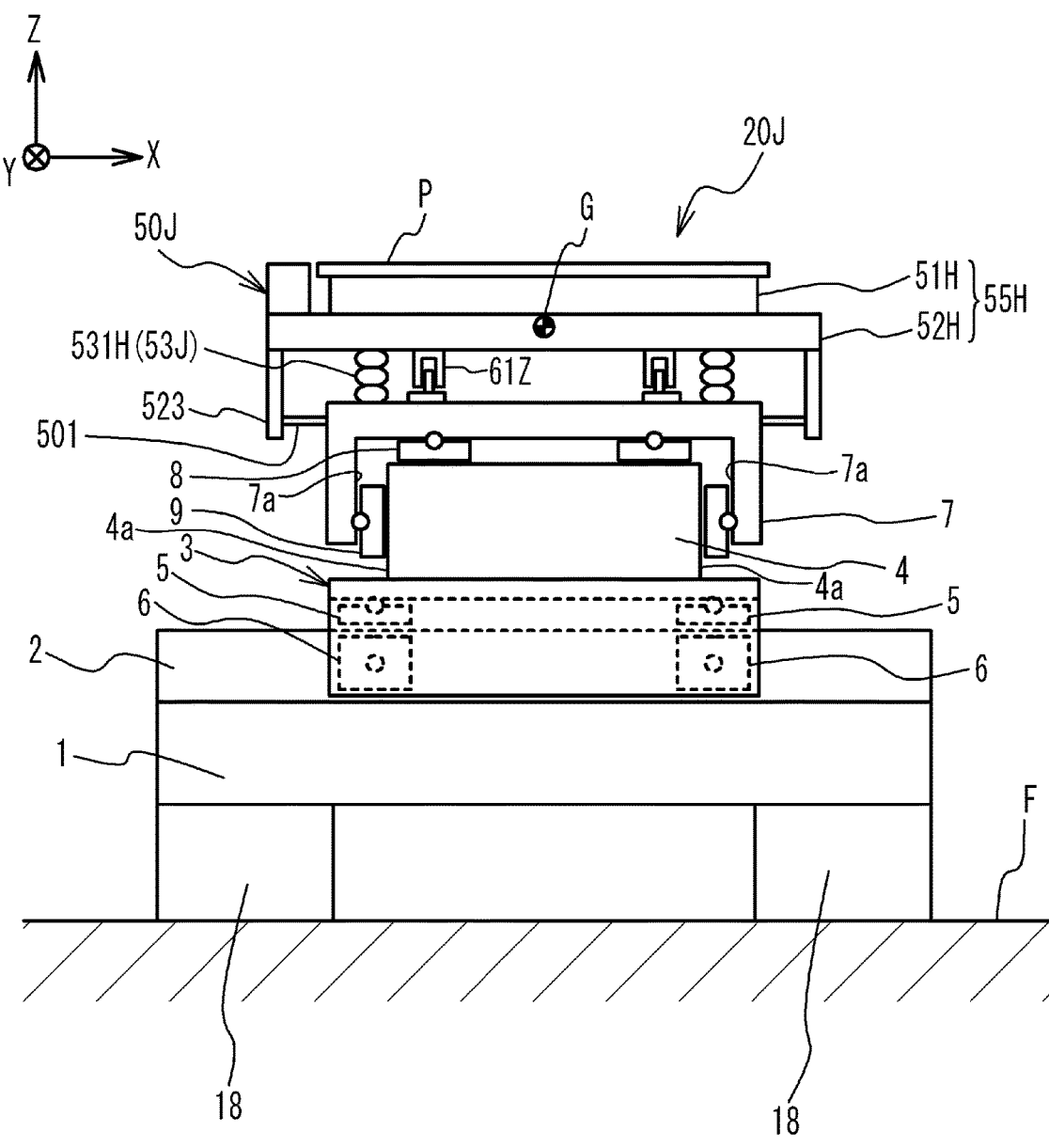
FIG. 14 illustrates a configuration of a plate stage apparatus in accordance with a variation of the second embodiment.

FIG. 14 illustrates a configuration of a plate stage apparatus 20J in accordance with a variation of the second embodiment. In the variation, the fine-adjustment stage 50H of the second embodiment is applied to a gantry stage, and the plate stage 52H is configured to be tiltable in the θx direction and the θy direction.

As illustrated in FIG. 14, the plate stage apparatus 20J includes a pair of X guides 2 (only one is illustrated in FIG. 14), X carriages 3, a Y beam guide 4, and a Y carriage 7.

The pair of the X guides 2 extending in the X-axis direction are laid on the upper surface of a bed 1 in parallel to each other at an interval in the Y-axis direction, and the X carriages 3 engaging with the respective X guides 2 are movably provided. On the X carriages 3, the Y beam guide 4 is suspended and fastened in a bridge shape extending along the Y-axis direction and connecting both carriages 3.

In FIG. 14, as indicated by dotted lines, a plurality of gas bearings 5 are arranged between each of the X carriages 3 and the upper surface of the corresponding X guide 2, and a plurality of gas bearings 6 are arranged between each of the X carriages 3 and the side surface of the corresponding X guide 2. The gas bearings 5 and 6 are fixed to the X carriage 3, and the X carriage 3 (and the Y beam guide 4 fixed to the X carriage 3) supported by the X guide 2 in a non-contact manner is guided by the X guide 2 to be movable in the X-axis direction. The gas bearings 6 of either one of the X carriages 3 may be omitted.

The Y carriage 7 is placed on the top of the Y beam guide 4. As illustrated in FIG. 14, a plurality of gas bearings 8 are disposed between the Y carriage 7 and the upper surface of the Y beam guide 4, and a plurality of gas bearings 9 are disposed between side surfaces 7a of the Y carriage 7 and side surfaces 4a of the Y beam guide 4. The gas bearings 8 and 9 are fixed to the Y carriage 7, and the Y carriage 7 supported by the Y beam guide 4 in a non-contact manner is guided by the Y beam guide 4 so as to be movable in the Y-axis direction. The upper surface of the Y beam guide 4 is finished to have a very high degree of flatness. In the variation of the second embodiment, the upper surface of the Y beam guide 4 serves as a movement reference surface.

The plate stage 52H is placed on the upper surface of the Y carriage 7 through a plurality of the gas springs 531H as a support mechanism 53J. The plurality of the gas springs 531H are arranged at different positions within the lower surface of the plate stage 52H, first ends of the gas springs 531H are fixed to the lower surface of the plate stage 52H, and second ends of the gas springs 531H are fixed to the upper surface of the Y carriage 7.

Further, for example, the movable elements of the Z voice coil motors 61Z are attached to the lower surface of the plate stage 52H, and the fixed elements of the Z voice coil motors 61Z are attached to the upper surface of the Y carriage 7.

Unlike the Z voice coil motor 62Z in the second embodiment, the Z voice coil motor 61Z in the variation does not have a Z guide that restricts the driving direction of the plate stage 52H only to the Z-axis direction. Therefore, the plate stage 52H can be tilted in the θx direction and the θy direction.

The plurality of the gas springs 531H deform in accordance with a change in the orientation of the plate stage 52H with respect to the upper surface of the Y beam guide 4, that is, the swing (tilt) of the plate stage 52H in the θx and θy directions. For example, when the plate stage 52H rotates by a predetermined angle in the θx direction (rotates about the X-axis) from a predetermined state, one gas spring 531H (e.g., the gas spring 531H provided closer to the +Y side than to the center of the plate stage 52H in the Y-axis direction) contracts, and another gas spring 531H (e.g., the gas spring 531H provided closer to the −Y side than to the center of the plate stage 52H in the Y-axis direction) expands. As a result, the plurality of the gas springs 531H arranged at different positions within the lower surface of the plate stage 52H support the plate stage 52H with mutually different forces.

In addition, a fine-adjustment stage 50J of the variation includes the leaf springs 501. A first end of the leaf spring 501 is connected to the lower end portion of the connecting member 523 extending from the lower surface of the plate stage 52H in the direction of gravity (the Z-axis direction), and a second end thereof is connected to the Y carriage 7. The leaf spring 501 is installed so that the thickness direction thereof is parallel to the Z-axis direction.

The rigidity in the Z-axis direction of the leaf spring 501 installed in this manner is small, and the rigidities in the X-axis direction and the Y-axis direction are large. Therefore, the leaf spring 501 restrains the plate stage 52H in the XY plane, but does not hinder the driving of the plate stage 52H in the θx direction and the θy direction. Since the natural frequency of the lower portion of the gas spring 531H can be increased by the leaf spring 501, the performance of the entire exposure apparatus can be improved as in the variation 1 of the first embodiment.

The plate stage apparatus 20J of the variation of the second embodiment includes the holding device 55H having a support surface for supporting the plate P, the support mechanism 53J that applies an upward force in the direction of gravity to the lower surface of the plate stage 52H included in the holding device 55H to support the holding device 55H, and the Z voice coil motor 61Z configured to move the holding device 55H so that the holding device 55H becomes, from a first state (for example, a state in which the upper surface of the plate holder 51A is parallel to the upper surface of the surface plate 19), in a second state in which the inclination angle of the support surface of the holding device 55H (the upper surface of the plate holder 51A) is changed. The support mechanism 53J supports the holding device 55H that becomes in the second state with mutually different forces at mutually different positions on the lower surface of the plate stage 52H in a direction intersecting the direction of gravity.

Since the weight of the holding device 55H is supported by the plurality of the gas springs 531H, the Z voice coil motor 61Z can drive the holding device 55H in the Z-axis direction with a small thrust force. As a result, the amount of heat generated by the Z voice coil motor 61Z can be reduced, and deterioration in position measurement accuracy due to temperature fluctuations can be inhibited.

In the second embodiment and the variation thereof, one gas spring 531 may be provided below the center of gravity G of the fine-adjustment stage, as in the first embodiment, instead of the plurality of the gas springs 531H. Further, as in the variations 3 of the first embodiment, a damping mechanism such as a damper mechanism may be provided in addition to a plurality of the gas springs 531H. Instead of a plurality of the gas springs 531H, a plurality of coil springs and a damping mechanism may be used as the support mechanism, as in the variation 6 of the first embodiment. A gas spring and a coil spring may be used in combination to support the plate stage. Further, a damping mechanism may be used in combination.

In the first embodiment and the variations 1 to 5 thereof, the case where the fine-adjustment stage includes one gas spring 531 has been described, but this does not intend to suggest any limitation, and the fine-adjustment stage may include a plurality of gas springs as in the second embodiment and the variation thereof.

In the first embodiment, the second embodiment, and the variations thereof, the plate stage may be magnetically levitated above the support portion 533 without using the gas spring or the coil spring. Note that a gas spring or a coil spring may be used in combination with magnetic levitation to support the plate stage above the support portion 533.

In each of the above-described embodiments, an equal magnification system is used as the projection optical system 16, but this does not intend to suggest any limitation, and a reduction system or an enlargement system may be used.

The application of the exposure apparatus is not limited to an exposure apparatus for liquid crystal in which a liquid crystal display element pattern is transferred to a rectangular glass plate, but can be widely applied to, for example, an exposure apparatus for manufacturing an organic EL (Electro-Luminescence) panel, an exposure apparatus for manufacturing a semiconductor, and an exposure apparatus for manufacturing a thin film magnetic head, a micromachine, a DNA chip, and the like. The present invention can also be applied to an exposure apparatus that transfers a circuit pattern onto a glass substrate or a silicon wafer in order to manufacture a mask or a reticle used in not only a microdevice such as a semiconductor element but also an optical exposure apparatus, an EUV exposure apparatus, an X-ray exposure apparatus, an electron beam exposure apparatus, or the like.

The plate to be exposed is not limited to a glass plate, but may be another object such as a wafer, a ceramic substrate, a film member, or a mask blank. When the object to be exposed is a basal plate for a flat panel display, the thickness of the basal plate is not particularly limited, and the basal plate may be in the form of a film (a sheet-like member having flexibility). The exposure apparatus of the present embodiment is particularly effective when the exposure object is a plate having a side length or diagonal length of 500 mm or greater. When the plate to be exposed is in the form of a flexible sheet, the sheet may be formed into a roll.

In addition, a liquid crystal display element as a micro device can be manufactured using the exposure apparatus according to each of the above embodiments. First, a so-called optical lithography process is performed in which a pattern image is formed on a photosensitive substrate (such as a glass substrate coated with a resist). By this optical lithography process, a predetermined pattern including a large number of electrodes and the like is formed on the photosensitive substrate. Thereafter, the exposed substrate is subjected to various steps such as a developing step, an etching step, and a resist removing step, whereby the predetermined pattern is formed on the substrate. Thereafter, a liquid crystal display element as a microdevice can be obtained through a color filter forming step, a cell assembling step, a module assembling step, and the like.

Note that the disclosures of all publications, international publications, U.S. patent application publications, and U.S. patents relating to exposure apparatuses and the like cited in the above description are incorporated herein by reference.

The embodiments described above are examples of preferred embodiments of the present invention. However, the present invention is not limited thereto, and various modifications can be made without departing from the scope of the present invention.

What is claimed is:

1. A stage apparatus comprising:
a movable body having a first support surface for supporting an object;
a support portion that is elastically deformable, has a predetermined thickness, and supports the movable body, the support portion being configured so as to be not in contact with the object when the object is supported by the movable body;
a support device having a second support surface that supports the support portion; and
a drive unit configured to move the movable body so that an angle between the first support surface and the second support surface is changed,
wherein the support portion elastically deforms so that heights of the support portion in a direction of gravity at positions different from each other in a direction orthogonal to the direction of gravity become different from each other in accordance with a change in the angle caused by the drive unit to support the movable body.

2. The stage apparatus according to claim 1,
wherein the drive unit includes:
a first drive unit configured to move the movable body supported by the support portion relative to the support device, and
a second drive unit that includes a first member provided to the first drive unit and a second member provided to the movable body, and is configured to move the movable body relative to the first drive unit through the first member and the second member disposed without being in contact with each other.

3. The stage apparatus according to claim 2, wherein the second drive unit transmits a driving force for causing the movable body to move relative to the support device by the first drive unit to the movable body through the first member and the second member.

4. The stage apparatus according to claim 3, wherein the first member is provided at a position substantially coinciding with a center of gravity of a structure including the movable body and the support portion.

5. The stage apparatus according to claim 4, wherein the second drive unit rotationally moves the structure about the center of gravity as a rotation center.

6. The stage apparatus according to claim 2, further comprising:
a leaf spring having a first end connected to the movable body and a second end connected to the support portion, the leaf spring being installed so that a thickness direction thereof is parallel to a direction orthogonal to a movement reference plane of the movable body.

7. The stage apparatus according to claim 1, wherein the support portion is connected to the movable body.

8. The stage apparatus according to claim 1, wherein the support portion includes a damping mechanism that generates a damping force in a direction of gravity with respect to the movable body.

9. The stage apparatus according to claim 1, wherein the support portion is an air spring filled with gas.

10. The stage apparatus according to claim 9, wherein the movable body is hollow, and wherein an inside of the movable body and an inside of the gas spring are communicated with each other.

11. The stage apparatus according to claim 1, wherein the support portion is a coil spring.

12. An exposure apparatus comprising:

the stage apparatus according to claim 1; and a pattern forming device configured to form a predetermined pattern on the object by an energy beam.

13. The exposure apparatus according to claim 12, wherein the object is a basal plate used in a flat panel display.

14. The exposure apparatus according to claim 13, wherein a length of at least one side or a diagonal length of the basal plate is equal to or greater than 500 mm.

15. A method of manufacturing a flat panel display, comprising:

exposing an object using the exposure apparatus according to claim 12; and developing the object that has been exposed.

16. A device manufacturing method comprising:

exposing an object using the exposure apparatus according to claim 12; and developing the object that has been exposed.

\* \* \* \* \*